(12) United States Patent
van der Laan

(10) Patent No.: US 11,488,747 B2
(45) Date of Patent: Nov. 1, 2022

(54) SUPERCONDUCTING POWER CABLE SYSTEM

(71) Applicant: Advanced Conductor Technologies LLC, Boulder, CO (US)

(72) Inventor: Daniël Cornelis van der Laan, Longmont, CO (US)

(73) Assignee: Advanced Conductor Technologies LLC, Boulder, CO (US)

(*) Notice: Subject to any disclaimer, the term of this patent is extended or adjusted under 35 U.S.C. 154(b) by 134 days.

(21) Appl. No.: 16/439,200

(22) Filed: Jun. 12, 2019

(65) Prior Publication Data

US 2020/0005968 A1  Jan. 2, 2020

Related U.S. Application Data

(60) Provisional application No. 62/691,521, filed on Jun. 28, 2018.

(51) Int. Cl.
*H01B 12/16* (2006.01)
*H01B 12/04* (2006.01)

(52) U.S. Cl.
CPC ............ *H01B 12/16* (2013.01); *H01B 12/04* (2013.01)

(58) Field of Classification Search
CPC ...................................................... H01B 12/16
USPC ............................................................ 174/15
See application file for complete search history.

(56) References Cited

U.S. PATENT DOCUMENTS

| | | | | |
|---|---|---|---|---|
| 8,938,278 B2* | 1/2015 | van Der Laan | ....... | H01L 39/143 505/231 |
| 2004/0211586 A1* | 10/2004 | Sinha | ...................... | H01F 6/065 174/125.1 |
| 2007/0045265 A1* | 3/2007 | McKinzie, II | ............ | C07C 4/02 219/207 |
| 2007/0084623 A1* | 4/2007 | Yamaguchi | ............ | H02G 15/34 174/125.1 |
| 2008/0110659 A1* | 5/2008 | Ashibe | ...................... | H01R 4/68 174/15.5 |

(Continued)

OTHER PUBLICATIONS

Michael, Test of a conduction cooled prototype superconducting magnet, Mar. 2012, MIT, Cambridge, MA, https://dspace.mit.edu/bitstream/handle/1721.1/94463/12ja007_full.pdf?sequence=1 (Accessed Jun. 1, 2021).*

(Continued)

*Primary Examiner* — Stanley Tso
(74) *Attorney, Agent, or Firm* — Foley & Lardner LLP

(57) ABSTRACT

A superconducting power cable system includes a superconducting power cable in a first temperature environment separated from a second temperature environment by a thermal barrier. The first temperature environment is an interior of a cryostat and is at a lower temperature than the second temperature environment located outside of the cryostat. At least one superconducting feeder cable has a first end electrically coupled to the superconducting power cable in the first temperature environment, and a second end electrically coupled to a normal conducting current lead in the second temperature environment. Each superconducting feeder cable is a flexible superconducting cable or wire formed of multiple superconducting tapes that are wound in a helical fashion and in multiple layers around a round former.

30 Claims, 17 Drawing Sheets

(56) References Cited

U.S. PATENT DOCUMENTS

| | | | | |
|---|---|---|---|---|
| 2008/0192392 A1* | 8/2008 | Folts | ................. | H02H 9/023 |
| | | | | 361/19 |
| 2009/0192042 A1* | 7/2009 | Kim | ................. | H01B 12/16 |
| | | | | 505/230 |
| 2011/0269630 A1* | 11/2011 | Schimidt | ................ | H02G 15/34 |
| | | | | 505/163 |
| 2012/0118600 A1* | 5/2012 | Choi | ................. | H02G 15/34 |
| | | | | 174/15.5 |
| 2013/0240236 A1* | 9/2013 | Yamaguchi | ........... | H01B 12/00 |
| | | | | 174/95 |
| 2014/0162882 A1* | 6/2014 | Graber | ................. | H02G 15/34 |
| | | | | 505/163 |
| 2014/0378312 A1* | 12/2014 | Tamada | ................ | H01B 12/16 |
| | | | | 505/163 |
| 2016/0053596 A1* | 2/2016 | Rey | ................... | E21B 43/2401 |
| | | | | 166/302 |
| 2018/0331529 A1* | 11/2018 | Stemmle | ................ | F17C 3/085 |
| 2019/0221335 A1* | 7/2019 | Yamaguchi | ............ | H01B 12/06 |
| 2019/0260194 A1* | 8/2019 | Stemmle | ................ | H01B 12/16 |
| 2020/0070686 A1* | 3/2020 | Tomita | ................... | B60M 1/12 |

OTHER PUBLICATIONS

Choi et al, Cryocooled Cooling System for Superconducting Magnet, Korean Basic Science Institute, Cryocoolers 15, International Cryocooler Conference, Inc., Boulder, CO, 2009, pp. 665-670 https://cryocoolerorg.wildapricot.org/resources/Documents/C15/080.pdf (accessed Jun. 1, 2021).*

Main Differences between conductors and superconductors, https://www.electricaltechnology.org/2019/10/difference-between-conductor-superconductor.html (accessed Jun. 1, 2021).*

* cited by examiner

SUPERCONDUCTING POWER CABLE SYSTEM

RELATED APPLICATIONS

This invention relates to priority U.S. Provisional Patent Application Ser. No. 62/691,521, filed Jun. 28, 2018 which is incorporated herein by reference.

TECHNICAL FIELD

This invention was made with government support under contract number N00024-14-C-4065 and N00024-16-P-4071 sponsored by the United States Department of the Navy. The government has certain rights in the invention.

BACKGROUND

Superconducting systems such as power transmission or distribution cables typically require large currents to be injected and extracted into and from the cold, cryogenic environment in which they operate. Typically, current is injected from room temperature, where the power source is located, into an environment at much lower cryogenic temperature. The cooling power at these low cryogenic temperatures can be limited.

Current leads may be used to inject current from room temperature into the cryogenic environment, and may be optimized to minimize the heat load though conduction and resistive heating. Feeder cables that connect to the current leads may include a section of high-temperature superconducting (HTS) material bridging the temperature from an intermediate value of less than 90 K down to the low-temperature application, which may operate at 4.2 K to 65 K, or higher.

The high-temperature superconducting feeder cables that connect to the current lead may contain a significant amount of normal conducting material, to avoid burnout of the current lead during fault conditions, such as loss of cooling or excessive currents. However, the normal conducting stabilizer in the feeder cable can result in a significant thermal load into the low temperature environment, through conduction. This can be problematic in cases in which limited cooling power is available, for example, when the application is cooled with pressurized cryogenic helium gas or other cryogenic gas.

It may be desirable to minimize the heat load into the cryogenic environment, especially in helium gas cooled applications. The feeder cable may be rigid and may not accommodate bending or thermal contraction of the much-longer power cable during cool down. In particular, when operating superconducting power transmission or distribution cables, the main power cable may experience a relatively large thermal contraction during cool down, compared to that of the cryostat in which the cable is housed. Thermal contraction can overstrain the cable and cause mechanical damage to the cable or the other components of the system. Accordingly, such thermal contraction must be accommodated by the feeder cables or the current leads.

SUMMARY OF THE DISCLOSURE

Superconducting systems that include, or are for connecting superconducting power transmission or distribution cables with normal conducting current leads are described herein. The normal conducting current lead may be connected to (or is configured to connect to) any suitable electrical power source for injecting current into the superconducting power cable, or to an electrical device, electrical system, further transmission system, or other application requiring electrical current from the power cable. The superconducting power cable may be of any suitable length and in some systems, may be sufficiently long to conduct electrical current from an electrical power source located remote from the application. The HTS feeder cable may be flexible, to allow significant thermal contraction of the superconducting power cable. The feeder cable may be designed to minimize the resistive and conductive loss into the cryogenic volume in which the superconducting power cable is located. The feeder cable is configured such that the HTS section bridges a thermal barrier between two volumes, where the volume in which the superconducting power cable is located is at a lower temperature than the volume on the opposite end. Both volumes are at a temperature at which certain materials are superconducting. The feeder cable may be configured such that the majority of the current is injected into the superconducting section of the feeder cable outside the volume in which the superconducting power cable is located. Current thus enters the volume in which the superconducting cable is located in the superconducting state, with minimal (or no significant) resistive loss being generated in the feeder cable. In combination with a reduced thermal conductivity along the feeder cable, systems may be configured to result in minimizing (or providing a lowest possible) heat load into the cryogenic volume of the superconducting power cable.

DETAILED DESCRIPTION

Figure 1:
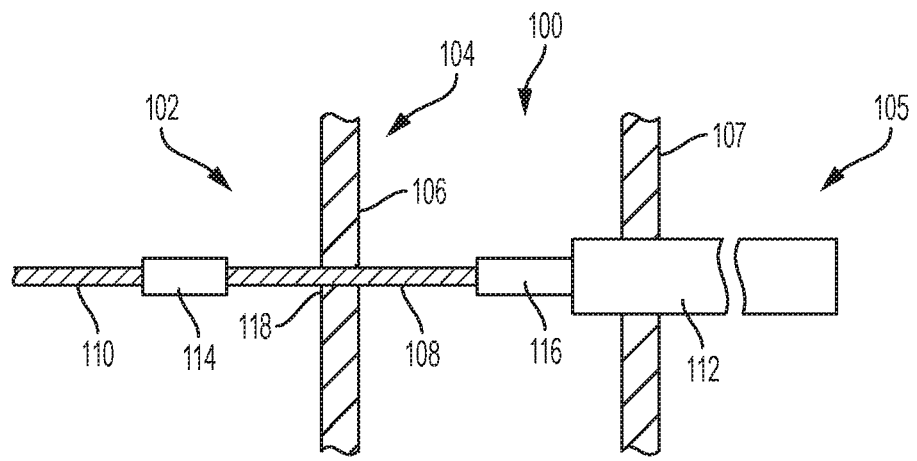
FIG. 1 is a schematic diagram of a system, according to an exemplary embodiment.

Embodiments described herein relate to superconducting systems that include, or are for connecting one or more superconducting power transmission or distribution cables with one or more normal conducting current leads, and methods of making and using such systems, including methods of injecting current into a superconducting power cable. In certain examples of any of the systems described herein, a normal conducting current lead may couple (or may be configured to couple) an electrical current power source to one end of the superconducting power transmission or distribution cable, for injecting electrical power (current) into the superconducting power cable through superconducting feeder cables. A further normal conducting current lead may couple (or be configured to couple) the other end of the superconducting power cable through superconducting feeder cables to any suitable electrical device, electrical system, further transmission or distribution system, or other application requiring electrical current. Accordingly, certain embodiments of systems described herein may be configured to conduct electrical power through one or more superconducting power cables over a suitable distance, to one or more normal conducting leads that connect to (or are configured to connect to) one or more electrical applications. Other embodiments described herein may be configured to inject electrical power into a superconducting power cable that is connected to (or is configured to connect to) a superconducting application in a low temperature environment.

Certain embodiments described herein include one or more superconducting feeder cables or wires that connect one or more superconducting power transmission cables in a low temperature environment, to one or more normal conducting leads or cables in a higher or intermediate temperature environment. In particular examples, the superconducting feeder cables or wires include efficient and flexible HTS sections that contain limited amounts of normal conducting material to minimize the thermal conduction along their length, while allowing safe operation during a fault. In addition, particular examples are configured to minimize the resistive heat load on the low-temperature environment, associated with injecting the current from the normal conducting current lead.

According to certain examples described herein, the feeder cables are formed from thin and flexible superconducting cables or wires formed of multiple superconducting tapes (such as, but not limited to $RE-Ba_2Cu_3O_{7-\delta}$ (REBCO) tapes) that are wound in a helical fashion and in multiple layers around a round former or core. The winding direction (and angle of helical winding) of each adjacent layer may be reversed, to maximize the number of overlapping tape portions. In certain examples, the HTS section of the feeder cables or wires are Conductor on Round Core (CORC®) cables, such as, but not limited to those described in U.S. Pat. No. 8,938,278 (which is incorporated herein by reference, in its entirety).

In certain examples, the HTS feeder cables or wires connect (or are configured to connect) the normal-conducting current lead located outside of the low-temperature environment (such as a cryostat), with the superconducting power cable, magnet, or other application, located within the low-temperature environment (such as a cryostat). Current is injected into the superconducting feeder cable or wire on the outside of the low-temperature cryostat, but at an intermediate temperature at which superconductivity in the feeder cable or wire is supported. The intermediate temperature is lower than room temperature, but higher than the temperature at which the superconducting application operates within the low-temperature cryostat. In particular examples, current is injected into the superconducting feeders outside of the low-temperature cryostat, minimizing the resistive heat into the low-temperature environment. The CORC® feeder cables or wires may contain a relatively low amount of normal conducting material, to minimize the heat load through conduction along their length.

In certain examples, the CORC® feeder cables or feeders may be configured with multiple HTS, Rare Earth-Barium-Copper Oxide, REBCO tapes that are wound on a core, with a relatively small winding pitch, in multiple layers, and with the winding direction being reversed between layers. Such winding configurations can be configured to allow the tapes to slide during bending. In addition, such winding configurations can result in a high level of current sharing between the tapes. Such current sharing can improve the ability of the CORC® feeders to safely operate, even during a fault such as an over-current or loss of cooling event, and minimize the risk of local burnout. At the same time, the CORC® feeder cables are flexible, allowing the cables to be easily orientated with respect to the power transmission cable. The CORC® feeder cable flexibility also allows the feeder cables or wires to contain an amount of slack, such as a bow or spiral in the length of the cable, to accommodate thermal contraction of the superconducting power cable.

The superconducting feeder cable or wire is connected to the normal conducting current lead in a manner such that the warmest end of the feeder cable or wire is still below a temperature where superconductivity is possible. The feeder cable or wire may be configured and arranged to experience most of the temperature gradient from the higher temperature at which superconductivity is supported to the low temperature of the superconducting power cable. In certain examples, the feeder cable or wire is configured to be superconducting at the operating current of the power cable system. Accordingly, the critical current of the feeder cable or wire at its highest temperature (where it connects to the normal current lead) should be at least equal to or higher than the operating current of the system. Similarly, the power transmission or distribution cable may be configured to be superconducting at the operating current of the power cable system at its highest temperature, which may be much lower than the highest temperature that the feeder cable will experience. Accordingly, the superconducting power cable may be configured to have a much lower number of superconducting tapes than the superconducting feeder cables or wires. The critical current of the power transmission or distribution cable at the low-temperature environment may be designed to be higher than the operating current of the feeder cable. The superconducting material from which the feeder cables are wound may be similar, or different from that of the main superconducting power cable.

In certain examples, the connection between the CORC® feeder and the normal conducting current lead coming from room temperature is cooled with a separate or different cooling system than the cooling system used for the main power transmission or distribution cable. A higher cooling power may be available at a higher or intermediate temperature of between 60 and 90 K, because cooling is much more efficient at such higher temperatures compared to the much lower temperature at which the power cable is likely operated.

While the feeder cables or wires are designed to operate in their superconducting state, in certain examples, the feeder cables or wires are configured to transition rapidly into a normal conducting state, in case of overcurrent or loss of cooling to the feeder cables. The feeder cables or wires may be configured to provide a high level of current sharing between the tapes in the feeder cables or wires, to allow the rapid transition to normal, reducing the risk of local burnout, even in examples without significant normal conducting material connected in parallel with the superconducting tapes in the feeder cables.

A high level of current sharing between tapes in the CORC® feeder cables or wires, in combination with the low amount of stabilizing material in the feeder cables or wires can result in a rapid development of voltage over the length of the feeder cables or wires, in case of an overcurrent. This allows the CORC® feeder cables or wires to act as fault current limiting (FCL) elements in the superconducting power cable system, that limit the over current by developing a significant voltage over their length. In particular examples, this voltage can be detected, and the detection is used to trigger the system to disconnect the superconducting cable. By employing the CORC® feeder cables or wires act as the only FCL elements in the system, the system may be able to recover more quickly after a fault clears, because the feeder cables or wires may be close to the more powerful cooling source used to cool the connection between the feeder cables or wires and the normal conducting current lead coming from the room temperature environment. However, the main power transmission or distribution cable may require a longer recovery time, such as where the cooling method for the main power cable uses helium gas that can be less effective.

In some contexts, it may be possible to inject current from a normal conducting current lead, into a superconducting power cable that is, for example, located in a helium gas-cooled cryostat, by providing superconducting cable terminations that extend beyond the helium gas cryostat, into a volume (space) of a higher temperature environment. In those contexts, current could be injected from the normal-conducting current lead, directly into the superconducting power cable, in the higher temperature environment. However, that arrangement may not be ideal, because the number of superconducting tapes or wires required in the power cable may be determined by the warmest temperature the cable experiences anywhere along its length. The higher temperature at the connection between the superconducting power cable and normal conducting current lead may require a higher number of tapes in the superconducting cable, compared to the situation where the entire superconducting power cable is located at the lower temperature.

For example, if the temperature within the helium gas cryostat is 50 K and the temperature just outside the helium gas cryostat where the terminals of the power transmission or distribution cable are connected to the normal-conducting current lead is 77 K, then to carry a given operating current, the power transmission cable may require about 4 to 5 times as many REBCO (superconducting tapes), as compared to the case where the entire superconducting power cable is located at 50 K. This is because the critical current $I_c$ of the superconducting tapes, which is the maximum current they can carry in the superconducting state, increases by a factor of about 4-5, when going from 77 K to 50 K.

Accordingly, embodiments described herein provide further, different or improved solutions. For example, in certain embodiments described herein, one or more relatively short superconducting feeder cables or wires are provided to bridge the temperature gradient between the power transmission or distribution cable located in a low-temperature environment, such as, but not limited to a helium gas cryostat at low temperature, and the connection to the normal-conducting current lead at an intermediate or higher-temperature environment. In particular examples, each superconducting feeder cable or wire is a CORC® feeder cable or wire, or other feeder cable or wire having multiple superconducting tapes or wires (such as, but not limited to HTS, Rare Earth-Barium-Copper Oxide, RE-Ba$_2$Cu$_3$O$_{7-\delta}$ (REBCO), Bi$_2$Sr$_2$Ca$_2$Cu$_3$O$_x$ (Bi-2223), or Bi$_2$Sr$_2$CaCu$_2$O$_x$ (Bi-2212) wires or tapes) that are wound on a core, with a relatively small winding pitch, in several layers.

The length of each superconducting feeder cable or wire may depend upon the application of use, but, typically are relatively short compared to the length of the superconducting power transmission or distribution cable. In some examples, each feeder cable or wire may have a length with in a range such as, but not limited to 0.2-1 meter.

The superconducting feeder cables or wires may be connected to the main power cable within the low-temperature environment or cryostat, which may be at about 50 K (or in the range of about 4.2 K to about 65 K). As a result, the main power cable in the low-temperature environment or cryostat may have a lower number of superconducting tapes or wires, as compared to a cable configuration in which the superconducting cable terminations of the main power cable extend out from the low-temperature environment or cryostat, to bridge into the higher-temperature environment.

In particular embodiments, the superconducting feeder cables or wires contain a higher number of superconducting tapes as compared to the main power cable, because the feeder cables experience the higher-temperature environment outside of the cryostat, where the temperature may be, for example, about 77 K (or anywhere in the range of about 65 K to about 100 K) at one or more locations along their lengths. The feeder cables may bridge to the low temperature environment or cryostat, through a thermal barrier. Current may be injected into one or more feeder cables at the intermediate or higher-temperature side of the thermal barrier, such that all current runs in the superconducting tapes in the feeder cables, through the thermal barrier.

In the system 100 shown in FIG. 1, a low temperature environment 102 is separated from an intermediate or higher-temperature environment 104 by a thermal barrier 106. The low-temperature environment 102 may be, for example, but not limited to a cryostat having an interior temperature at about 50 K, or in the range of 4.2 K to 65 K, in which case the thermal barrier 106 may be a cryostat wall. The intermediate or higher-temperature environment 104 may be at a temperature of, for example, but not limited to about 77 K, or in the range of 65 K to 100 K.

A superconducting feeder cable system including a superconducting feeder cable 108, such as, but not limited to a CORC® feeder cable (or other feeder cable or wire having multiple superconducting tapes as described herein), is connected to and between a superconducting power transmission or distribution cable 110 and a normal conducting current lead 112. In certain examples, a first end of the feeder cable 108 is connected to the superconducting power cable 110 by a first connector terminal 114, while a second end of the feeder cable (opposite the first end) is connected to the normal conducting current lead 112 by a second connector 116. The feeder cable 108 has a length portion between the first end and the second end that extends through the thermal barrier 106, from the low-temperature environment 102, to the intermediate or higher-temperature environment 104. The current lead 112 may extend (toward the right of FIG. 1) from the intermediate or higher-temperature environment 104, to a further environment 105 that may be at room or ambient temperature (such as, but not limited to a temperature at or near 290K to 300 K).

The first and second connector terminals 114 and 116 may have any suitable electrical connector configuration and may have similar configurations with respect to each other. Alternatively, the first connector terminal 114 may have a different configuration than the second connector terminal 116. In particular examples, the first connector terminal 114 has a configuration as described herein with reference to the terminal or terminal section 802 in FIG. 8 or 9, and the second connector terminal 116 has a configuration as described in U.S. Pat. No. 9,755,329 (which is incorporated herein by reference, in its entirety).

In certain examples, the low-temperature environment 102 is located in an interior volume of a cryostat, and the thermal barrier 106 is a wall of the cryostat. In certain examples, the thermal barrier 106 (or cryostat wall) may contain a vacuum space, thermal insulation material or other suitable type of thermal insulation, to thermally separate the interior volume of the cryostat (in which the superconducting power cable 110 is housed at a low temperature) from the intermediate or higher-temperature environment 104 (where the normal conducting current lead 112 terminates). The intermediate temperature volume may also be located within a cryostat, in which a second thermal barrier 107 separates the volume at intermediate temperature from the room temperature environment.

In certain examples, each end of the superconducting power transmission or distribution cable 110 may be coupled, through a respective feeder cable or wire, to a different respective normal conducting current lead 112 in an intermediate-temperature environment 104, which is separated from a higher-temperature environment 105 by, for example, the second thermal barrier 107. In those examples, two volumes are located at each end of the superconducting power cable 110, and separated by a thermal barrier 106 from the low-temperature environment 102 in which the superconducting power cable 110 is located. Both intermediate-temperature volumes 104 may have an intermediate cryogenic temperature higher than that of the low temperature environment 102 in which the superconducting power transmission cable 110 is located.

The superconducting feeder cable 108 extends through the thermal barrier 106, as shown in FIG. 1, for example, through a sealed passage 118 in the thermal barrier 106, that is sealed against a higher gas pressure within the low-temperature environment 102 relative to pressure in the intermediate or higher-temperature environment 104. For example, the sealed passage 118 may seal against a gas pressure within the low-temperature environment 102 that may be, but is not limited to, a helium gas pressure of 300 psi or higher, as compared to the pressure in the intermediate or higher-temperature environment 104, which may be at or close to atmospheric pressure or vacuum or other suitable pressure.

In certain examples, the feeder cable 108 contains a plurality of high-temperature superconducting tapes or wires, such as, but not limited to REBCO coated conductors having a thin superconducting film deposited on a metal substrate. According to certain examples, the feeder cables are CORC® cables or wires that have a configuration as described in U.S. Pat. No. 8,938,278 (which is incorporated herein by reference, in its entirety). In other embodiments, the feeder cables can have other suitable configurations.

In certain examples, some (or each) of the superconducting tapes in the feeder cable 108 have a substrate made of a relatively thin metal having a relatively low thermal conductivity, further minimized by minimizing the substrate thickness, to limit the conductive heat load of the current lead into the cold environment. In particular examples, the superconducting tapes in the feeder cable 108 have a substrate made of stainless steel, Hastelloy C-276 or other suitable material, having a thickness of about 50 μm or less.

In further examples, the superconducting tapes of the feeder cable 108 include a thin metal layer such as copper (for example, but not limited to 5 μm or less) plated or otherwise formed on the outside of the tapes, to allow for easy soldering and to provide additional electrical stability. In other examples, no copper plating is present on the superconducting tapes of the feeder cable 108. Alternatively or in addition, a layer of normal conducting material that is not a metal, or is a metal alloy, is either plated, laminated or otherwise formed onto one or more (or each) superconducting tape in the feeder cable 108. Alternatively or in addition, the feeder cable 108 may include superconducting tapes made from other HTS materials, such as but not limited to Bi-2223, Bi-2212, or low temperature superconducting materials such as $Nb_3Sn$, NbTi or $MgB_2$.

In examples in which the feeder cable or wire 108 includes REBCO coated conductors wound on a former core, multiple superconducting tapes could be arranged and wound on the former, in parallel to increase the current capacity of the feeder. For example, multiple tapes may be arranged in parallel, by winding the tapes on a small-diameter, round former, in a helical fashion to create a CORC® cable or wire. The former may be metallic or other suitable material that minimizes heat conduction such as, but are not limited to plastic, nylon, or metals such as but not limited to stainless steel or Hastelloy. In certain examples, the former comprises a hollow structure (e.g., a hollow tube structure) to further reduce the thermal conductivity of the feeder cable or wire 108.

In further examples, the superconducting feeder cable system includes a plurality of CORC® feeder cables or wires (or other feeder cables or wires having multiple superconducting tapes as described herein), connected in parallel. Multiple feeder cables or wires in parallel can provide benefits including increasing the current capacity of the feeder cable system relative to a single cable or wire configuration, and allowing the thickness of each feeder cable or wire to be reduced or minimized, to improve the flexibility of the feeder cable system. In addition, coupling multiple feeder cables in parallel can improve the electrical connection to the superconducting power transmission cable 110, or to the current lead 112, by allowing the current to be injected into the cable 110 or current lead 112 from multiple locations or sides, to reduce or minimize the electrical resistance of the connection.

Figure 2:
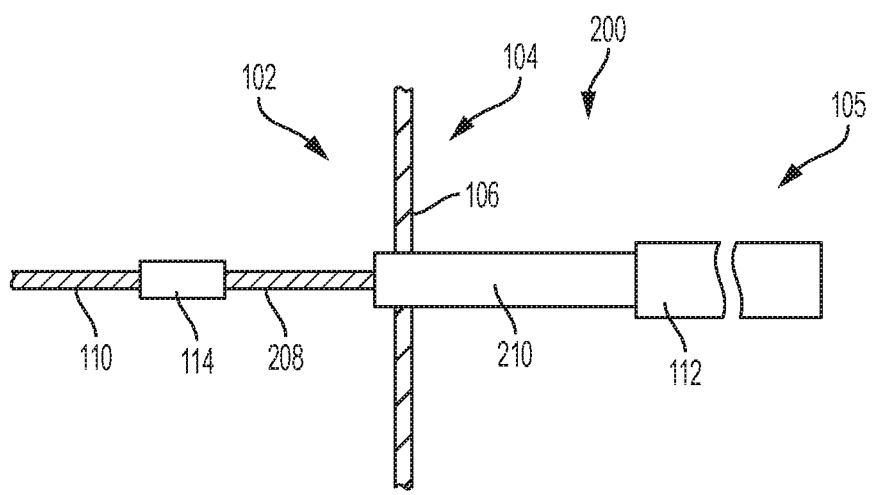
FIG. 2 is a schematic diagram of a system, according to an exemplary embodiment.

An example of a system 200 shown in FIG. 2 includes a low temperature environment 102 that is separated from an intermediate or higher-temperature environment 104 by a thermal barrier 106, similar to the system 100 of FIG. 1. Also similar to the system 100, in the system 200, the superconducting power transmission or distribution cable 110 is located within the low-temperature environment 102 (for example, within a cryostat), while the current lead 112 is located in the intermediate or higher-temperature environment 104. Also similar to the system 100, the current lead 112 in the system 200 may extend to a yet higher-temperature environment, such as, but not limited to a room temperature environment 105.

The system 200 includes a superconducting feeder cable system, including one or more feeder cables 208, each having a configuration similar to that of the one or more feeder cables 108 described herein. The one or more (or each) feeder cable 208 has one end that is coupled to the superconducting power cable 110, through a connector terminal 114 corresponding to the connector terminal 114 described herein with respect to the connection of feeder cable 108 to the superconducting power cable 110. However, in the example system 200, a second end of the one or more (or each) feeder cable 208 terminates in a terminal structure 210 that is part of, or is coupled to, the thermal barrier 106. The terminal structure 210 connects to the normal conducting current lead 112, and extends from the thermal barrier 106, at least partially into the intermediate or higher-temperature environment 104 (for example, outside of the cryostat). The terminal structure 210 may be integrated as part of the barrier 106, or in a configuration that is easier to seal with the barrier 106 (compared to sealing the feeder cable 108 with the barrier 106 in FIG. 1), to allow for easier sealing of the thermal barrier against gas pressure.

The terminal structure 210 may comprise an electrical clamp, solder or any suitable electrical connector terminal structure, for electrically connecting the feeder cable 208 with the current lead 112. In particular examples, the terminal structure 210 comprises an electrical coupling structure such as, but not limited coupling structures as described in U.S. Pat. No. 9,755,329 (which is incorporated herein by reference, in its entirety).

Figure 3:
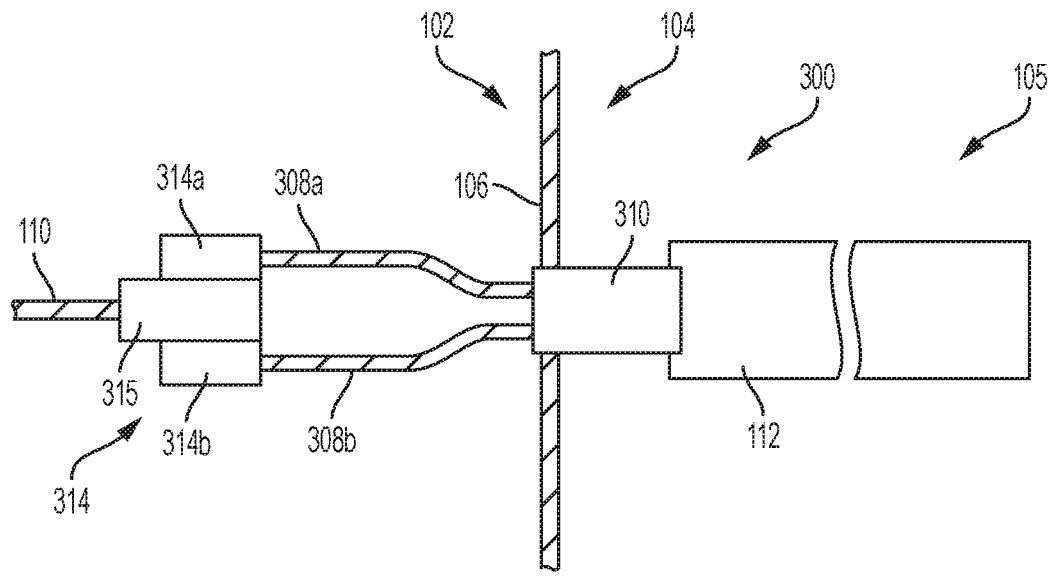
FIG. 3 is a schematic diagram of a system, according to an exemplary embodiment.
Figure 4:
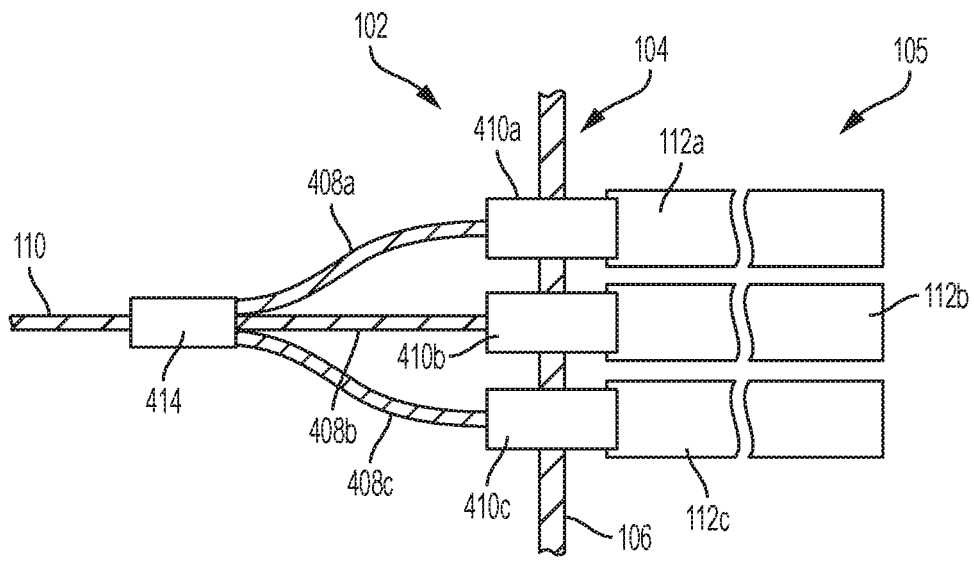
FIG. 4 is a schematic diagram of a system, according to an exemplary embodiment.

In further examples, the feeder cable or wire 208 may be composed of a plurality of feeder cables or wires as described herein, such as, but not limited to CORC® cables or wires. FIGS. 3 and 4 show examples of systems 300 and 400, that have a plurality of feeder cables 308a and 308b (in FIG. 3), or 408a, 408b and 408c (in FIG. 4).

In certain examples in which a plurality of CORC® feeder cables or wires (or other types of superconducting feeder cables or wires having multiple superconducting tapes as described herein) are used as a feeder for a power transmission or distribution cable, the system may include one (single) mutual terminal (e.g., similar to connector terminals 114 or 210 in FIG. 2), but in which a plurality (or all) of the feeder cables or wires are terminated. Alternatively, the system may include a plurality of terminals or terminal sections, and each one of the feeder cables or wires may have an end that terminates in its own respective one of the terminals or terminal sections, relative to the terminals in which the other feeder cables terminate. Alternatively, the system may include multiple terminals, each having more than one of the feeder cable or wire terminations.

For example, the systems 300 and 400 in FIGS. 3 and 4, each include a feeder cable system having a plurality of (two in FIG. 3, and three in FIG. 4) feeder cables (308a and 308b in FIG. 3, and 408a, 408b and 408c in FIG. 4). Each of the feeder cables in FIGS. 3 and 4 may have a configuration similar to that of the feeder cable 108, including but not limited to the CORC® cables described herein. Other examples of the system 300 may include more than two of such feeder cables, and other examples of the system 400 may include two or more than three of such feeder cables.

Each of the systems 300 and 400 in FIGS. 3 and 4 includes a low temperature environment 102 that is separated from an intermediate or higher-temperature environment 104 by a thermal barrier 106, similar to the system 100 of FIG. 1 and the system 200 of FIG. 2. Also similar to the systems 100 and 200, in the system 300, the superconducting power transmission or distribution cable 110 is located within the low-temperature environment 102 (for example, within a cryostat), while the current lead 112 is located in the intermediate or higher-temperature environment 104. Also similar to the systems 100 and 200, the current lead 112 in the system 300 may extend to a yet higher-temperature environment, such as, but not limited to a room temperature environment 105.

The system 300 of FIG. 3 includes a connector terminal structure 314 having respective terminals or terminal sections 314a, 314b and 315. Each of the feeder cables 308a and 308b has a first end coupled to a different respective terminal or terminal section 314a or 314b. Each terminal or terminal section 314a and 314b may be configured similar to the connector terminal 114 discussed herein, but electrically coupled together or to the power cable terminal or terminal section 315, in which one end of the superconducting power cable 110 terminates. The terminals or terminal sections 314a, 314b and 315 may be separate terminals that are electrically coupled together as described below, or may be electrically-coupled sections of a single terminal structure. Each of the feeder cables 308a and 308b has a second end coupled to one (single) mutual normal conducting terminal 310. The terminal 310 may be similar to the terminal 210, but contains the termination of both of the feeder cables 308a and 308b. Thus, in particular examples, the terminal 310 may be formed by soldering an end of each of the feeder cables 308a and 308b in a copper tube or other electrically conductive structure as described in U.S. Pat. No. 9,755,329 (which is incorporated herein by reference, in its entirety).

In the system 400 of FIG. 4, each of the superconducting feeder cables 408a, 408b and 408c has a first end coupled to one (single) mutual connector terminal 414, in electrical connection with the superconducting power cable 110. The connector terminal 414 may be similar to the connector terminal 114 (or terminals 314a and 314b), but contains the termination of all of the feeder cables 408a, 408b and 408c. Each of the feeder cables 408a, 408b and 408c has a second end coupled to a different respective normal conducting terminal 410a, 410b or 410c. Each connector terminal 410a, 410b or 410c may be similar to the connector terminal 210, or may comprise any other suitable electrical coupling structure. In particular examples, each of the connector terminals 410a, 410b or 410c may be formed by soldering an end of the feeder cable 408a, 408b or 408c in a copper tube or other electrically conductive structure similar to the connections of CORC® cables in terminals as described in U.S. Pat. No. 9,755,329 (which is incorporated herein by reference, in its entirety).

In the system 400 of FIG. 4, each of the terminals 410a, 410b or 410c may connect (on the intermediate or higher-temperature environment side of the thermal barrier 106) to a separate, respective current lead 112a, 112b or 112c, each of which may be similar to the current lead 112. Alternatively, some or all of the terminals 410a, 410b or 410c may connect (on the intermediate or higher-temperature environment side of the thermal barrier 106) to the same one (single) mutual current lead (not shown), similar to the current lead 112.

Figure 5:
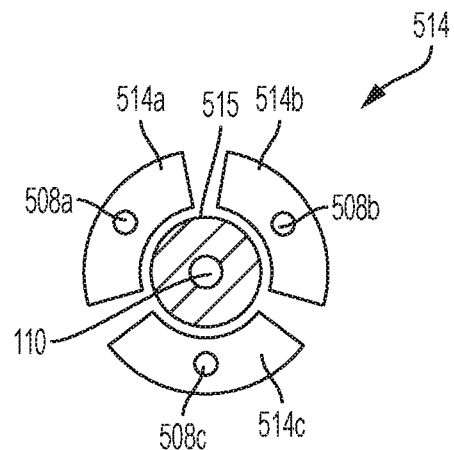
FIG. 5 is a schematic diagram of a connector terminal that may be used in various exemplary embodiments of the system.
Figure 6:
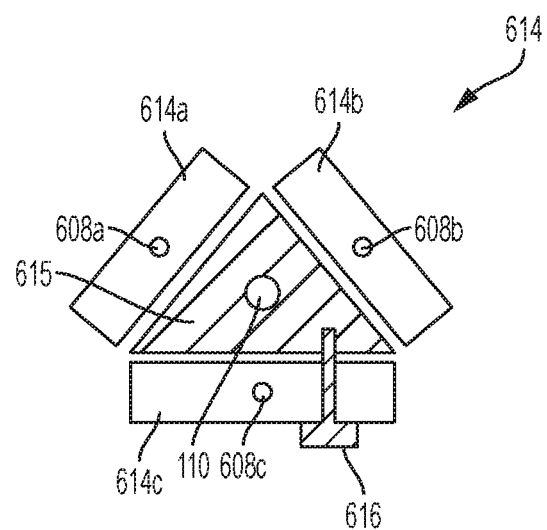
FIG. 6 is a schematic diagram of a connector terminal that may be used in various exemplary embodiments of the system.

FIGS. 5 and 6 show examples of connector terminal structures 514 and 614 and methods of electrically connecting, for feedthrough, a plurality of CORC® feeder cables (or a plurality of other feeder cables or wires having multiple superconducting tapes as described herein) to a superconducting power transmission or distribution cable 110. The drawings of FIGS. 5 and 6, each show a cross-section view of a connector terminal structures 514 or 614, taken perpendicular to the longitudinal axis of the terminal end of the superconducting power cable 110 held therein.

Each of the connector terminal structures 514 and 614 includes a plurality of connector terminals or terminal sections, corresponding in number to the number of feeder cables being coupled to the superconducting power transmission or distribution cable 110. The connector terminal structures 514 or 614 each have three connector terminals or terminal sections (514a, 514b and 514c in FIG. 5, and 614a, 614b and 614c in FIG. 6), for connection to three respective feeder cables (508a, 508b and 508c in FIG. 5, and 608a, 608b and 608c in FIG. 6), each of which may be a CORC® feeder cable (or other feeder cable or wire having multiple superconducting tapes as described herein). Connector terminal structures similar to 514 or 614 (with three, two or more than three connector terminals or terminal sections) may be employed in various systems, including systems as described herein, for example, as connector terminal structure 314 in the system 300 of FIG. 3. Each of the feeder cable connector terminal or terminal section 514a-c, 614a-c is made of an electrically conductive material such as, but not limited to a low-resistance copper, and contains a recess or central channel into which the terminal end of a respective one or more of the feeder cables is soldered or otherwise held. In FIGS. 5 and 6, each terminal section 514a-c or 614a-c contains a terminal end of one respective feeder cable. In other examples, one or more (or each) terminal section 514a-c or 614a-c contains terminal ends of two or more feeder cables.

In each of FIGS. 5 and 6, the superconducting power transmission or distribution cable 110 has a termination end located in the connector terminal or terminal section 515 or 615. The connector terminal or terminal section 515, 615 may comprise an electrically conductive structure, such as, but not limited to, a generally tubular structure made of a metal or other electrically conductive material. In particular examples, the connector terminal or terminal section 515, 615 is made of a low-resistance copper, and contains a recess or central channel into which the terminal end of the superconducting power cable 110 is soldered or otherwise held.

In FIG. 5, the power transmission or distribution cable connector terminal or terminal section 515 has a round, cylindrical shape, with a central channel in which the superconducting power cable 110 terminates. The cross-section shape (taken perpendicular to the longitudinal axis of the cylinder shape) of the connector terminal or terminal section 515 is shown in FIG. 5 as being generally round or circular. Other examples include a power transmission cable connector terminal or terminal section similar to the connector terminal or terminal section 515, but with a different cross-section shape (such as, but not limited to the shape of a triangle, rectangle, other polygon, oval or other curvature). For example, the power transmission cable connector terminal or terminal section 615 in FIG. 6 has a prism shape, with a triangle-shaped cross section (taken perpendicular to the longitudinal axis of its prism shape).

In particular examples, the terminals or terminal sections 514a-c, 614a-c for the superconducting feeder cables 508a-c, 608a-c have a shape that corresponds to the outer surface shape of the power transmission or distribution cable connector terminal or terminal section 515, 615. The feeder cable terminals or terminal sections 514a-c, 614a-c are configured to abut against and make electrical contact with the outer surface of the power cable terminal or terminal section 515, 615, to electrically couple the feeder cable terminals or terminal sections 514a-c, 614a-c to the power cable terminal or terminal section 515, 615.

Thus, in FIG. 5, the terminals or terminal sections 514a-c, each are composed of an electrically conductive body having a rounded, radially inward-facing surface, that faces and corresponds to or matches (in shape and diameter of curvature) the curvature of the round-cylindrical power cable terminal or terminal section 515. Each of the terminal sections 514a-c also includes a central channel in which a corresponding one or more of the CORC® feeder cables terminates.

In FIG. 6, the terminals or terminal sections 614a-c, each are composed of an electrically conductive body having a generally rectangular, block or plate shape, having a flat surface facing and abutting a corresponding flat side surface of the power transmission or distribution cable terminal or terminal section 615. Each of the terminal sections 614a-c includes a central channel in which a corresponding one of the feeder cables terminates.

In the examples of FIGS. 5 and 6, the superconducting feeder terminals or terminal sections (514a-c or 614a-c) are mounted to the power transmission or distribution cable terminal or terminal section (515 or 615) by any suitable connection mechanism that holds the terminal sections together in electrical communication, including, but not limited to a clamping structure, one or more bolts or other threaded connectors, solder, weld, other conductive adhesive, or the like. In certain examples, one or more clamps, straps or bands are provided around the terminals or terminal sections (514a-c and 515, or 614a-c and 615), to help press and hold the terminal or terminal section together.

With reference to FIG. 5, a round-cylindrical shaped power transmission or distribution cable terminal or terminal section 515 can help simplify assembly of the connection terminal structure 514. In particular, the feeder cable terminals or terminal sections 514a-c in FIG. 5) may be coupled to the round-cylinder shaped power transmission cable terminal or terminal section 515, in any rotational position of the power transmission cable terminal or terminal section 515. Accordingly, during assembly, the round-cylinder shaped power cable terminal or terminal section 515 may be at any rotational position.

With reference to FIG. 6, a power cable terminal or terminal section 615 with flat surfaces may provide one or more other advantages. Such advantages may include an ability to simplify manufacturing of the feeder cable terminals or terminal sections 614a-c, and an ability to provide a lower contact resistance between the superconducting power cable terminal or terminal section 615 and the terminals or terminal sections 614a-c of the superconducting feeder cables, by increasing the contact surface area between those terminals or terminal sections. Additionally, terminals or terminal sections having flat contact surfaces as shown in FIG. 6 may be configured large enough to allow for one or more bolts or other threaded connectors (e.g., bolt 616) to secure one or more (or each) of the feeder cable terminals or terminal sections 614a-c to the power cable terminal or terminal section 615.

In particular examples of FIGS. 3, 5 and 6, each superconducting feeder cable (e.g., 308a-b, 508a-c or 608a-c) is electrically coupled to a connector terminal or terminal section (e.g., 314a-b, 514a-c or 614a-c). In addition, the superconducting power transmission or distribution cable (e.g., 110) may be a CORC® cable or other superconducting cable with multiple layers of superconducting tapes as described herein, and is electrically coupled to a connector terminal or terminal section (e.g., 315, 515 or 615). A CORC® cable-to-terminal connection can be accomplished in any suitable manner including, but not limited to the methods and structures as described in U.S. Pat. No. 9,755,329 (which is incorporated herein by reference, in its entirety).

Figure 7:
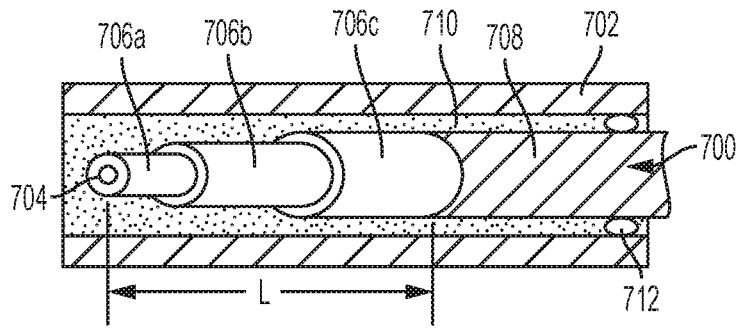
FIG. 7 is a schematic diagram of a connector terminal that may be used in various exemplary embodiments of the system.

FIG. 7 shows an example of a terminal end of a CORC® cable 700 (or other cable with multiple layers of superconducting tapes as described herein) electrically coupled to and within a connector terminal or terminal section 702. In FIG. 7, the cable 700 may represent any of the feeder cables 308a-b, 508a-c or 608a-c or the power cable 110 described herein. Similarly, the connector terminal or terminal section 702 may represent any of the connector terminal or terminal sections 314a-b, 514a-c, 614a-c, 515 or 615 described herein.

In FIG. 7, the cable 700 extends into a central channel of the terminal or terminal section 702, through an opening on one end (the right side end in FIG. 7) of the terminal or terminal section 702. The cable 700 has a plurality of superconductor tapes wound on a former 704, in multiple layers 706a-c of tapes, and an outer sheath or outer layer 708 of insulation material covering the wound tapes. A section of the outer sheath or layer 708 has been removed from a length portion L of the terminal end of the cable 700, and at least one (or multiple) superconducting tapes in each of the multiple layers 706a-c are exposed. The terminal end of the cable 700 is located within the central channel of the connector terminal or terminal section 702, and solder or other conductive filler 710 electrically couples the superconducting tapes with the conductive body of the terminal or terminal section 702. One or more seals 712 may be provided at one or each of the ends of the terminal or terminal section 702.

Figure 8:
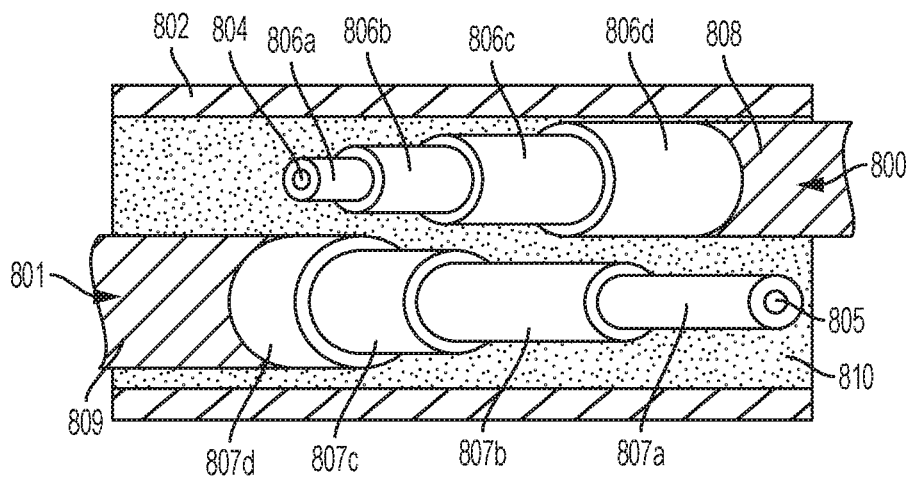
FIG. 8 is a schematic diagram of a connector terminal that may be used in various exemplary embodiments of the system.

FIG. 8 shows an example of the terminal ends of two respective CORC® cables 800 and 801 (or other cables with multiple layers of superconducting tapes as described herein), electrically coupled to each other and to and within a connector terminal or terminal section 802. In FIG. 8, the cable 800 may represent any of the superconducting feeder cables 108, 208 or 408a-c, while the cable 801 may represent the superconducting power transmission or distribution cable 110 described herein. Similarly, the connector terminal or terminal section 802 may represent any of the connector terminal or terminal sections 114 or 414 described herein.

In FIG. 8, the cable 800 extends into a central channel of the terminal or terminal section 802, through a first opening on one end (the right side end in FIG. 8) of the terminal or terminal section 802. In addition, the cable 801 extends into the central channel of the terminal or terminal section 802, through a second opening on the opposite end (the left side end in FIG. 8) of the terminal or terminal section 802, relative to the end having the first opening. Each of the cables 800 and 801 has a plurality of superconductor tapes wound on a former (804 or 805), in multiple layers (806a-d or 807a-d) of tapes, and an outer sheath or outer layer (808 or 809) of insulation material covering the wound tapes. A section of the outer sheath or layer (808 or 809) has been removed from a length portion of the terminal ends of the cables 800 and 801, and at least one (or multiple) superconducting tapes in each of the multiple layers (806a-d and 807a-d) are exposed. The terminal end of each of the cables 800 and 801 is located within the central channel of the connector terminal or terminal section 802, and solder or other conductive filler 810 electrically couples the superconducting tapes with the conductive body of the terminal or terminal section 802. One or more seals may be provided at one or each of the ends of the terminal or terminal section 802.

In the example in FIG. 8, the cables 800 and 801 are arranged such that the multiple layers 806a-d of the cable 800 align with the multiple layers 807a-d of the cable 801, layer-by-layer, on a one-to-one basis. In this arrangement, the layer 806a of the cable 800 may be arranged to contact and electrically couple with the layer 807d of the cable 801. Similarly, the layer 806b of the cable 800 may contact and electrically couple with the layer 807c of the cable 801, the layer 806c of the cable 800 may contact and electrically couple with the layer 807b of the cable 801, and the layer 806d of the cable 800 may contact and electrically couple with the layer 807a of the cable 801. In other examples, the cables 800 and 801 may have fewer or greater numbers of layers, arranged in layer-by-layer alignment as described with respect to FIG. 8. Also, in other examples, a layer-by-layer alignment may include an alignment in which more than one layer of one of the cables 800 or 801 aligns with and contact one of the layers of the other cable 800 and 801. For example, two (or more) layers of the cable 800 may be arranged adjacent and spaced, or adjacent and in contact with each one of the layers of the cable 801. In particular examples, the ends of each layer 806a-d of the cable 800 and of each layer 807a-d of the cable 801 may be flared outward as shown in FIG. 9 to allow some or all of the layers of each cable to make direct contact with the alignment-associated layers of the other cable, and to the inner surface of the body of the terminal or terminal section 802.

Figure 9:
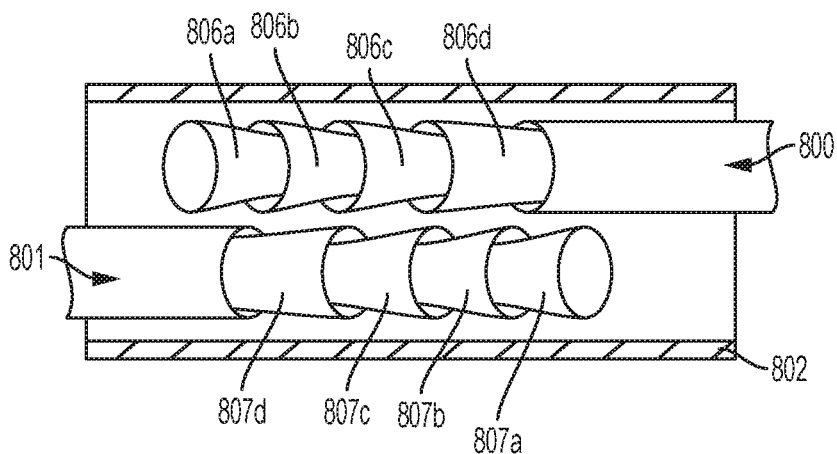
FIG. 9 is a schematic diagram of a connector terminal that may be used in various exemplary embodiments of the system.

In the examples of FIGS. 8 and 9, the terminal ends of the cables 800 and 801 are arranged in opposite directions relative to each other, for example, by arranging the terminal ends of the cables 800 and 801 to extend into respectively opposite ends of the terminal or terminal section 802. In further examples, more than one cable may be arranged with its terminal end in either (or both) of the directions, within the terminal or terminal section 802. In other examples, two or more cables may be arranged in the same direction relative to each other as shown in FIG. 10, for example, by arranging the terminal ends of the cables 800 and 801 to extend into the same end of the terminal or terminal section 802.

Examples described with reference to FIGS. 5-10 show various connection methods and structures, connecting one or more superconducting feeder cables with a superconducting power transmission or distribution cable, where each of the feeder cables and the power cables may be a CORC® cable (or other cable with multiple layers of superconducting tapes as described herein). Embodiments described herein may include. A connection between a CORC® feeder cable (e.g., 108, 208, 308*a-b*, 408*a-c*, 508*a-c* or 608*a-c*) and a CORC® power cable (e.g., 110) can be accomplished in any suitable manner including, but not limited to using methods and structures as described herein and in U.S. Pat. No. 9,755,329 (which is incorporated herein by reference, in its entirety).

An example method of connecting one or more CORC® feeder cables and a CORC® power transmission or distribution cable may include, first, extending the cables into one or more ends of the terminal or terminal section (702 or 802) and through the central channel, such that the terminal ends of the cables extend out of the opposite end of the channel. Then, the method includes removing a length portion L of the outer sheath or cover (708, 808, 809), to expose tapes in an outer layer of the cable. The method, then, includes trimming the outer layer to expose a further layer of tapes. The trimming is carried out to expose at least one (or multiple) tapes in each of a plurality of layers of tapes, along the length portion L.

Figure 10:
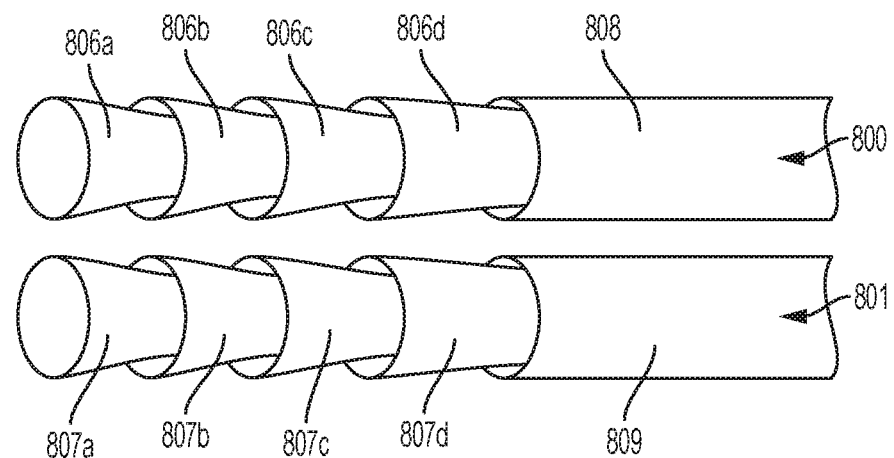
FIG. 10 is a schematic diagram of a pair of superconductor cable ends for a connector terminal that may be used in various exemplary embodiments of the system.

Once the terminal ends of the cables are trimmed, the terminal ends of the cables are aligned with each other (in layer-by-layer engagement, as shown in FIGS. 8-10), and the body of the terminal or terminal section (702 or 802) is slid over the aligned, trimmed terminal ends, to cover the terminal ends. In examples in which the terminal end of only one cable is within the terminal or terminal section (as shown in FIG. 7), the body of the terminal or terminal section is slid over the trimmed terminal end without requiring alignment of layers with layers of a second cable.

The tapered layers may be flared outward (as described herein) to allow some or all of the layers to make direct contact the inner surface of the body of the terminal or terminal section (702 or 802), within the central channel in the terminal or terminal section, for improved electrical connection with the terminal or terminal section. The method may, then, include filling the space between the terminal end of each cable and the body of the terminal or terminal section with solder or other electrically conductive material (710 or 810). The electrically conductive material (710 or 810) may be a material that is flowable at a raised temperature, to be injected or flowed into the channel within the body of the terminal or terminal section (702 or 802), and then solidify within the channel, when cooled. In addition, the method may include installing one or more O-ring or other seals between each cable and the body of the terminal or terminal section.

In particular examples, the above method may include procedures as described in U.S. Pat. No. 9,755,329. In other examples, other methods and connector structures may be employed, to electrically connect a first end of a CORC® feeder cable to a CORC® superconducting power transmission or distribution cable for a low temperature environment (for example, a cryostat environment) side of the system. In various examples described herein, the second end of the CORC® feeder cable is connected to a normal conducting current lead that is located in an intermediate or higher-temperature environment side of the system.

Figure 11:
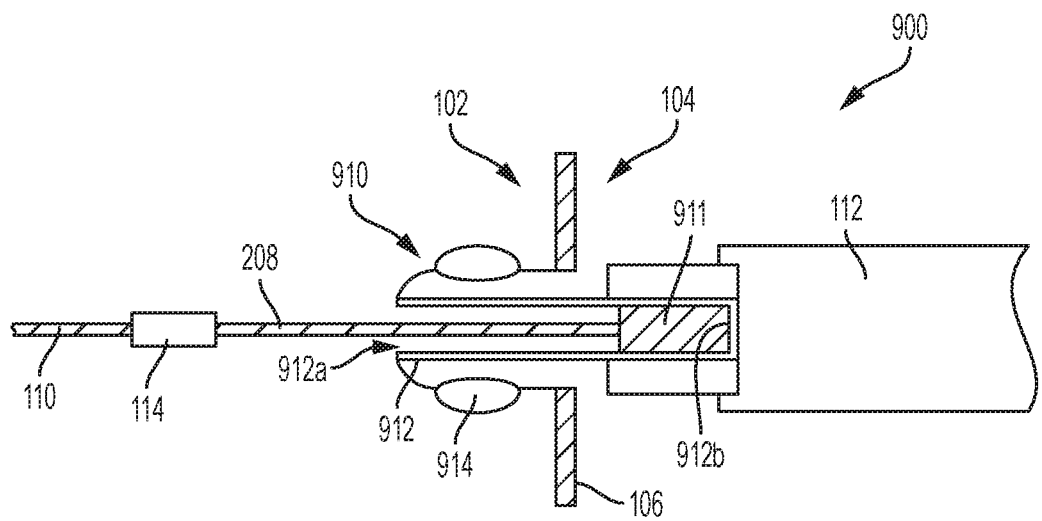
FIG. 11 is a schematic diagram of a system, according to an exemplary embodiment.

An example of a connector assembly 910 for connecting the second end of a superconducting feeder cable (such as a CORC® feeder cable) to a terminal end of a normal conducting current lead 112 is shown in FIG. 11. In certain examples, the connector terminal 210 in FIG. 2 has a configuration corresponding to the connector assembly 910 in FIG. 11. Accordingly, based on those examples, the feeder cable system 900 in FIG. 11 is shown with a feeder cable 208 coupled to a power transmission or distribution cable 210 through a connector 114, similar to the correspondingly numbered features in FIG. 2.

In the example in FIG. 11, the connector assembly 910 includes a hollow electrical conductive, or partly conductive tube or rod 912 that has an open end 912*a* and a closed end 912*b*, and a central channel extending partially into the tube or rod from the open end 912*a*. The second end of the feeder cable 208 (i.e., the cable end located toward the higher temperature side of the system 900) contains a terminal member 911, which may be similar to the terminal member of the connector 210 in FIG. 2. The feeder cable 208 with terminal member 911 extends into the central channel along a portion of the length of the hollow tube or rod 912, and is electrically connected to the hollow tube or rod 912, from inside the central channel. The terminal member 911 may be electrically coupled to a conductive section of the tube or rod, by solder or other conductive material within the hollow conductive tube or rod.

In certain examples, the tube or rod 912 is composed of a linear shaft that extends through an opening in the thermal barrier 106. The tube or rod 912 has a central bore that extends along a portion of the length of the shaft, from the open end 912*a* toward the opposite end, but terminates before reaching the opposite end, such that the opposite end of the tube or rod forms the closed end 912*b*. In other examples, the central bore may extend through the entire length of the shaft, and a cap, seal, wall or other closure structure may be arranged on or in one end of the shaft to form the closed end 912*b*.

The conductive tube or rod 912 may be made of any suitable metal or other electrically conductive material such as, but not limited to copper or a combination of copper and a metal with lower thermal conductivity. In certain examples, the conductive tube or rod 912 is connected to or part of a bushing having an electrical insulation material 914 separating the conductive tube or rod 912 from the thermal barrier 106 of the feedthrough.

The electrical insulating material 914 is located between conductive tube or rod 912 and the thermal barrier 106, to electrically insulate the conductive tube or rod 912 with respect to the thermal barrier 106. In certain examples, the electrical insulation material 914 comprises a ceramic material having sufficient mechanical strength, such as a ceramic bushing. In other examples, the insulation material 914 may be other types of electrical insulating material such as, but not limited to plastics, polymers, or epoxies. The insulation material 914 may be provided on the conductive tube or rod 912, for example, as a coating, layer or body (e.g., ceramic body) attached at one end of the conductive tube or rod 912.

The conductive tube or rod 912 may be connected with a flange or other feature of or on the thermal barrier 106, to form a gas-tight seal in the opening of the thermal barrier 106, to allow the low temperature environment (e.g., environment within the cryostat) to remain at a higher pressure relative to the intermediate or higher temperature environment 104 (e.g., environment outside of the cryostat). Accordingly, the insulation material 914, conductive tube or rod 912, and flange or other feature become part of the overall thermal barrier and pressure seal between the low temperature environment 102 and the intermediate or higher temperature environment 104 side of the system 900.

In the example in FIG. 11, the conductive tube or rod 912 and ceramic insulation material 914 may be formed as a bushing containing the CORC® feeder cable 208, and electrically insulated from the thermal barrier or flange by the ceramic insulation material 914. In that example, the superconducting power transmission or distribution cable 110 may be cooled with pressurized helium gas that is at a relatively low temperature, such as but not limited to 50 K. The components and connections are sufficiently strong to withstand a relatively high helium gas pressure of 300 psi or more. When the central bore of the tube or rod 912 extends through the entire length of the shaft, and a cap, seal, wall or other closure structure is arranged on or in one end of the shaft to form the closed end 912b, the seal should be strong enough to withstand the pressure difference between the inside and outside of the cryostat.

Figure 12A:
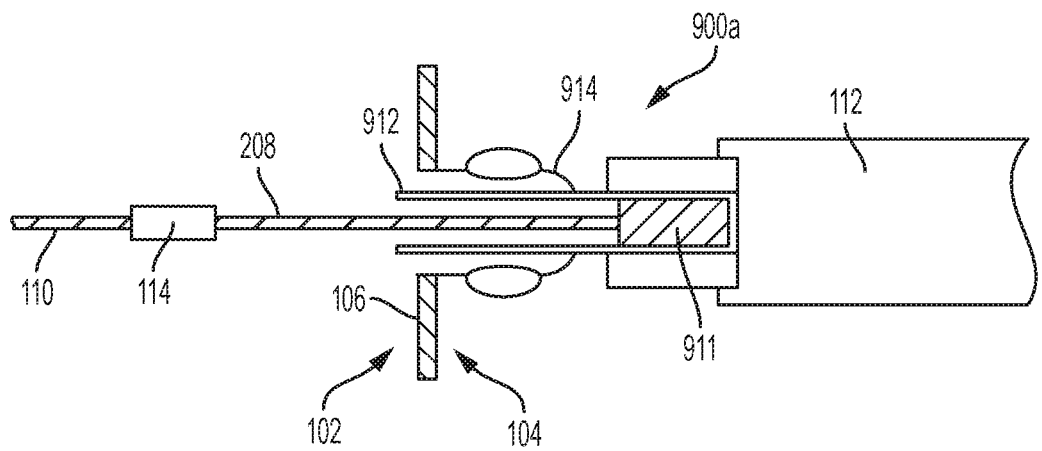
FIG. 12a-d are schematic diagrams of a system, according to an exemplary embodiment.

In the example in FIG. 11, the insulation material 914 may be composed of ceramic material (such as a coating, layer or body of ceramic material) on the conductive tube or rod 912, and located on the low temperature environment 102 side of the thermal barrier 106. In the example in FIG. 12a, a connector assembly 900a includes the insulation material 914 located on the intermediate or higher temperature environment 104 side of the thermal barrier 106.

Figure 12B:
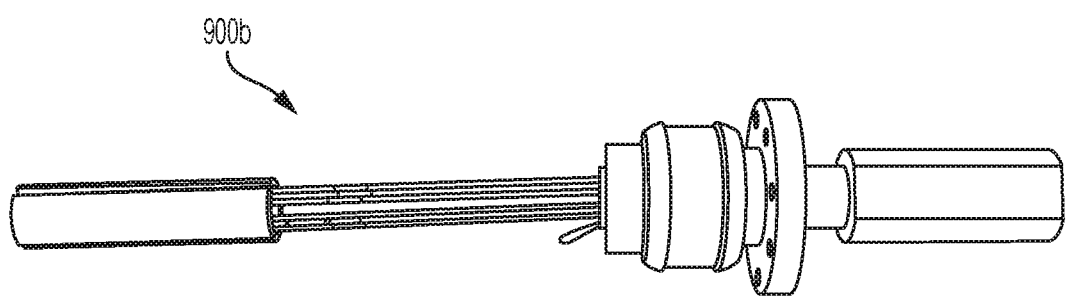
Figure 12C:
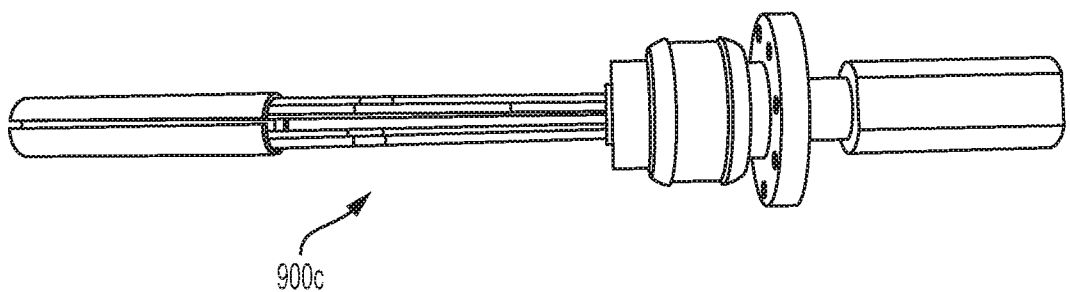
Figure 12D:
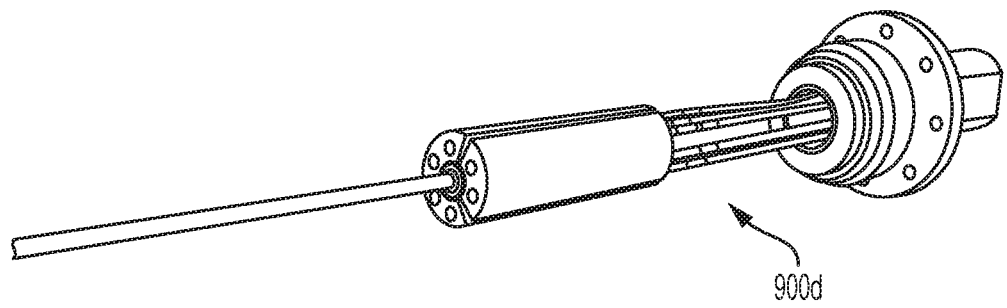

Further examples of connector assemblies 900b-d are shown in FIGS. 12b-d, where the connector assemblies 900b and 900d in FIGS. 12b-c each have two CORC® feeder cables and a ceramic insulator. The connector assembly 900d in FIG. 12d has six CORC® feeder cables that terminate in three terminal sections, where each terminal section has terminal ends of two CORC® feeder cables and is clamped to the round terminal section that contains a terminal end of the CORC® power transmission or distribution cable 110.

In certain examples, each CORC® feeder cable (208, 308a-b, 408a-c, 508a-c or 608a-c) has one end that terminates in a connector assembly (such as, but not limited to a connector assemblies 900-900d with terminals 911 as described with respect to FIGS. 11-12d) and is soldered, or otherwise mounted and electrically coupled to the closed end of the conductive tube or rod 912 in the connector terminal.

The connector assembly 910 may be mounted at a location at least partially within (or mostly or entirely within) the intermediate or higher temperature environment 104 side of the system. In the example in FIG. 11, the insulator material 914 is located primarily or entirely on the low temperature environment 102 side of the system, while the terminal end of the CORC® feeder cable 208 (and the solder or terminal block to which the terminal end of the CORC® feeder cable is coupled) is located on the intermediate or higher temperature environment 104 side of the system. The conductive, hollow tube or rod 912 (and the central channel of that tube or rod containing the CORC® feeder cable) extends through the thermal barrier 106, between the low temperature environment 102 side of the system and the intermediate or higher temperature environment 104 side of the system.

The normal conducting current lead 112 may be connected to the outside of the conductive, hollow tube or rod 912, by solder, clamp, bolt or other suitable electrical connection. The normal conducting current lead 112 may be connected to the conductive, hollow tube or rod 912, at a location (along the length of the tube or rod 912) corresponding to the location (along the length of the channel within the tube or rod 912) of the terminal end of the CORC® feeder cable 208 or of the solder or terminal block to which that cable end is coupled. Then, current may be injected into the CORC® feeder cable 208, from intermediate or higher temperature environment 104 side of the system, through the normal conducting current lead 112.

In certain examples, sufficient electrical conducting material is present as part of the conductive tube or rod 912, or coupled to the outer surface of the conductive tube or rod 912, such that a sufficiently large current can flow between the current lead 112 and the terminal member 911, to the CORC® feeder cable 208. Also in certain examples, the connection of the current lead 112 with the conductive, hollow tube or rod 912 is circumferential or partially circumferential around the hollow tube or rod 912 (or around the terminal end of the current lead 112) such that current enters the CORC® feeder cable terminal 911 radially, from all sides (or multiple sides, or circumferentially), such that the current paths to or from the current lead 112 to each of the superconducting tapes in the feeder cable 208 are about equal in length and thus have about equal resistance. Accordingly, current may enter the superconducting tapes of the CORC® feeder cable 208 through a resistive connection formed by the current lead 112, the conductive tube or rod 912 of the connector assembly 910, and the terminal end 911 of the CORC® feeder cable 208, entirely or mostly on the intermediate or higher temperature environment 104 side of the thermal barrier 106.

Therefore, during current injection, resistive heating of the normal-conducting components of the electrical connection of the terminal end of the CORC® feeder cable 208 may occur entirely (or mostly) on the intermediate or higher temperature environment 104 side of the thermal barrier 106. In addition, cooling fluid (such as, but not limited to liquid nitrogen, cryogenic helium gas or other cryocooler, for example, from the low temperature environment 102 side of the system) can access the terminal assembly from outside the low-temperature volume to help cool the electrical connection of the terminal end of the CORC® feeder cable 208 and the resistive connections to the current lead 112.

In certain examples, no significant resistive heating occurs in the CORC® feeder cable 208, on the low temperature environment 102 side of the thermal barrier 106, except at the location where the CORC® feeder cable 208 is connected to the power transmission or distribution cable 110. In further examples, a connection of the CORC® feeder cable 208 to the power cable 110 can be avoided, by having a length section near the terminal end of the power cable 110 be the feeder cable 208. By avoiding that connection and having an end section of the power transmission cable 110 become the feeder cable 208, further reduction in resistive heating may be accomplished. In such further examples, the terminal end of the power cable 110 may be soldered or otherwise mounted directly into the conductive tube or rod 912, as discussed above with respect to the terminal end of the feeder cable 208. However, in these examples, the power cable 110 may require a much larger number of superconducting tapes for the same operating current (relative to a system in which a CORC® feeder cable 208 is coupled between the terminal end of the power transmission cable 110 and the connector assembly 910, because the critical current of the power transmission cable is determined by its warmest part.

In certain system applications, it may be desirable or necessary to arrange one or more superconducting feeder cables (such as, but not limited to CORC® feeder cables) to extend in a first direction (such as a horizontal direction) and to connect to a power transmission or distribution cable that is also arranged to extend in the same, first direction (such as the horizontal direction). In such systems, connection arrangements as described with respect to FIGS. 1-12 may be employed.

Examples of systems in which one or more superconducting feeder cables (such as, but not limited to CORC® feeder cables) extends in a horizontal direction to connect to a power transmission or distribution cable that is also arranged to extend in the horizontal direction may include systems that employ one or more helium gas cooled power transmission or distribution cables located in a long flexible cryostat.

In other example system applications, it may be desirable or necessary to arrange one or more superconducting feeder cables (such as, but not limited to CORC® feeder cables) to extend in a different direction relative to the direction in which the power transmission or distribution cable extends. For example, in certain systems, one or more CORC® feeder cables may be oriented to extend vertically, while connecting to a power transmission or distribution cable that is oriented to extend horizontally. Alternatively, one or more CORC® feeder cables may be oriented to extend horizontally, while connecting to a power transmission or distribution cable that is oriented to extend vertically.

Figure 13:
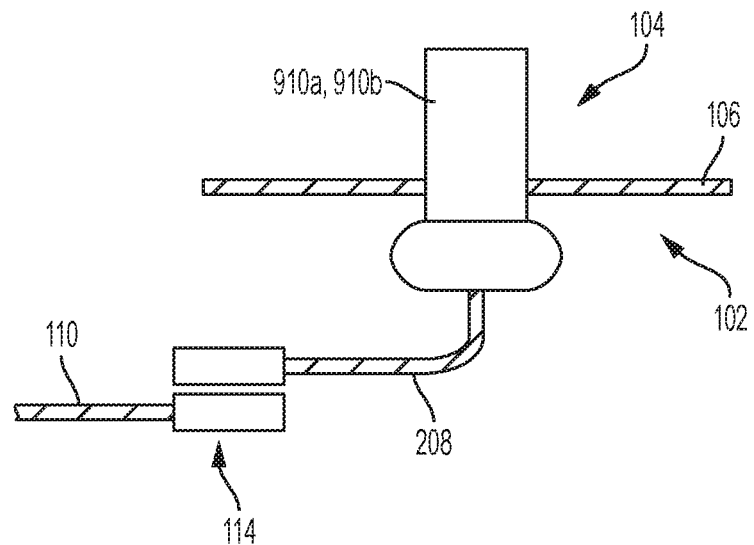
FIG. 13 is a schematic diagram of a connection configuration for a system, according to an exemplary embodiment.
Figure 14:
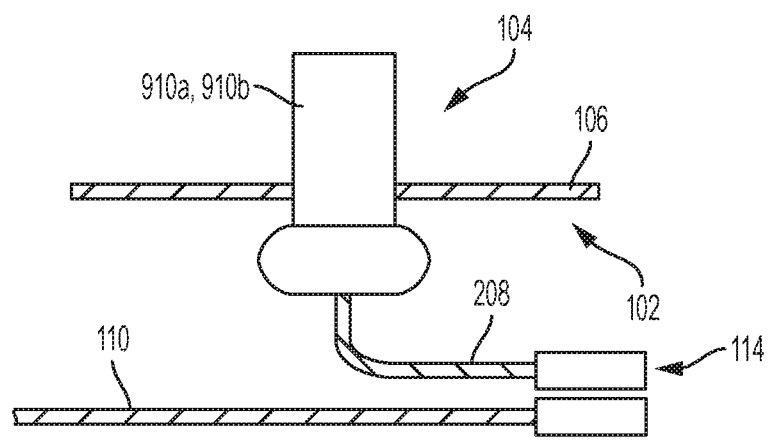
FIG. 14 is a schematic diagram of a connection configuration for a system, according to an exemplary embodiment.

For example, a vertical arrangement of the connector assembly 910 for one or more CORC® feeder cables, as shown in FIGS. 13 and 14, may allow for a larger space between feeder cables connecting to the individual phases of the power cable. For example, the connector assemblies of each feeder cable can be arranged along the length of the cryostat in which the superconducting power transmission or distribution cable is located. This allows for a larger separation between the connector assemblies, as compared to a case when they need to be located on the end of the relatively narrow cryostat. A larger space between feeder cables can allow the power cable to operate at a higher voltage (as compared to systems with smaller spaces between feeder cables).

In the example in FIG. 13, the (or each) feeder cable 208 is bent in a direction such that a terminal end of each feeder cable is arranged in a direction facing opposite to the direction of the terminal end of the power transmission cable 110. In the example in FIG. 14, the (or each) feeder cable 208 is bent in a direction such that a terminal end of the feeder cable is arranged in the same direction as the direction of the terminal end of the power transmission cable 110. In each of the examples of FIGS. 13 and 14, a connection terminal 114 may be configured to couple the feeder cable to the power cable, for example as described above with respect to FIGS. 5 and 6 (to connect any suitable number of feeder cables 208 to the power cable 110). In certain examples in which the feeder cable 208 is bent as shown in FIG. 14, the location of the connector terminal 114 may be easier to access (as compared to the example in FIG. 13), which may be beneficial during installation, testing or servicing of the system.

In particular examples, CORC® feeder cables and wires as described herein may be configured to be more flexible than conventional, rigid HTS current leads and the power transmission or distribution cable 110. Accordingly, the flexibility of feeder cables and wires 208 can allow for a greater number of options of types and locations of electrical connection terminals that may be used, including, but not limited to those described herein. Thus, in particular examples, the CORC® feeder cable or wire 208 may be bent in one or more relatively small diameter curves, to accommodate mounting options better than (or not available with), for example, more conventional, rigid HTS current leads.

In some system applications, such as, but not limited to those having relatively long power cables 110, a power cable may experience significantly higher thermal contraction than the cryostat in which it is housed when the low temperature environment 102 side of the system is cooled from, for instance, room temperature to a cryogenic operating temperature. Accordingly, it can be desirable to configure the system to allow the power cable 110 to contract (or expand) a sufficient amount to avoid mechanical damage or stress to the cable, for example, with a change in temperature in the low temperature environment 102 side of the system. In some examples of any of the systems described herein, a sufficient additional length of the power cable 110 is pushed into the cryostat during installation, to allow for some amount of contraction during cooling. However, in some contexts, it may not be practical or possible to push a sufficient additional length of the power transmission cable 110 into the cryostat to accommodate contraction.

Accordingly, in certain system examples of any of the systems described herein, thermal contraction of long power cables is accommodated by employing one or more feeder cables 208, each having sufficient flexibility to flex along its length (to expand (or contract) the distance between the first and second terminal ends of the feeder cable).

In particular examples, one or more CORC® feeder cables or wires may be employed as the feeder cable 208, as they can be formed to be relatively thin and flexible. In particular examples, feeder cables or wires (such as, but not limited to CORC® feeder cables or wires) that have a relatively short tape twist pitch (for example, of between 3 and 30 mm) with which the superconducting tapes are wound onto a relatively thin former, allowing tight bends of the feeder cable, may provide a sufficiently high level of flexibility to accommodate thermal contraction of the power cable. In particular examples, the feeder cables or wires are configured such that the tapes are able to slide during bending of the feeder cable or wire.

Figure 15:
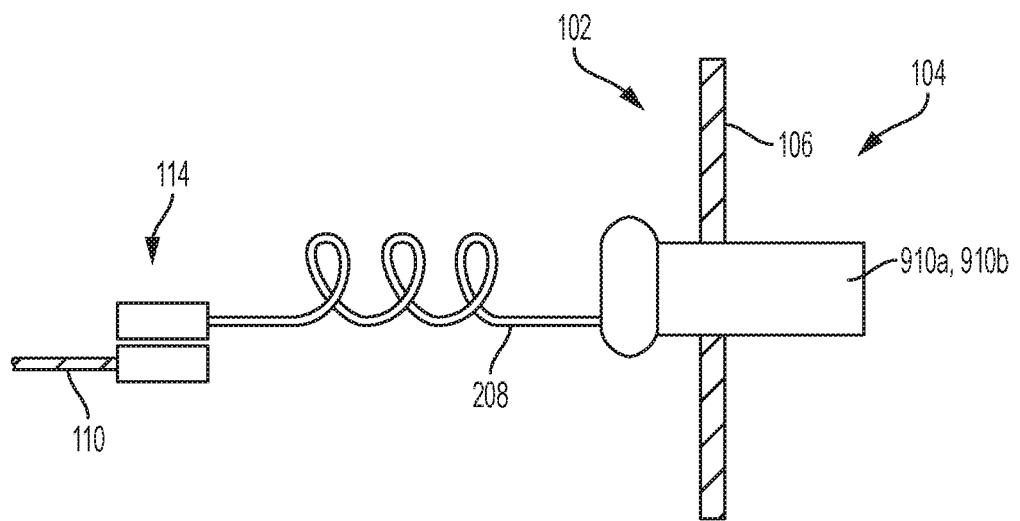
FIG. 15 is a schematic diagram of a system, according to an exemplary embodiment.
Figure 16:
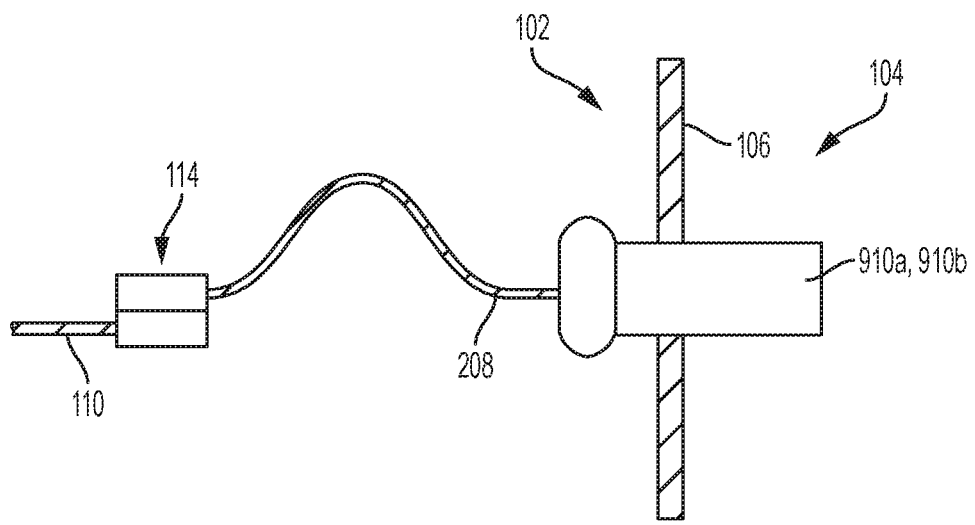
FIG. 16 is a schematic diagram of a system, according to an exemplary embodiment.

Certain examples of any of the systems described herein may include one or more feeder cables or wires 208 (such as, but not limited to CORC® feeder cables or wires) that extend in a coil spring, spiral, bow or other shape that provides slack along its length to accommodate thermal contraction of the power cable, such as, but not limited to the shapes shown in FIGS. 15 and 16. Such configurations can allow for significant movement of the terminal 114 in the length direction in which the power cable 110 contracts. An additional benefit of forming a feeder cable 208 into a coil spring, spiral, bow or other slack-providing shape, is that the effective length of the feeder cable is increased compared to a feeder cable. A longer effective cable length can reduce the thermal heat load through conduction into the low temperature (or cryogenic) environment 102 side of the system. This increases the thermal efficiency of the CORC® feeder.

In further examples of any of the systems described herein, additional thermal insulation material is provided on the low temperature environment 102 side, or on the intermediate or higher temperature environment 104 side of the thermal barrier 106. The thermal insulation material may be, but is not limited to a vacuum jacket, super insulation, insulating foam or other material of low thermal conductivity, and having appropriate dielectric properties that prevent voltage breakdown between the feeder cable 208 and the cryostat wall or other thermal barrier 106.

Additionally or alternatively, further examples of any of the systems described herein may include additional thermal insulation on the outside of the feeder cable 208 (for example, but not limited to, additional thermal insulation material on top of the electrical insulation that may be applied to a CORC® feeder cable). In certain examples, the additional thermal insulation applied to the feeder cable 208 includes any suitable thermal insulation including, but not limited to a material that is wrapped in a spiral ribbon around the feeder cable, to allow the feeder cable to remain flexible along its length.

Figure 17:
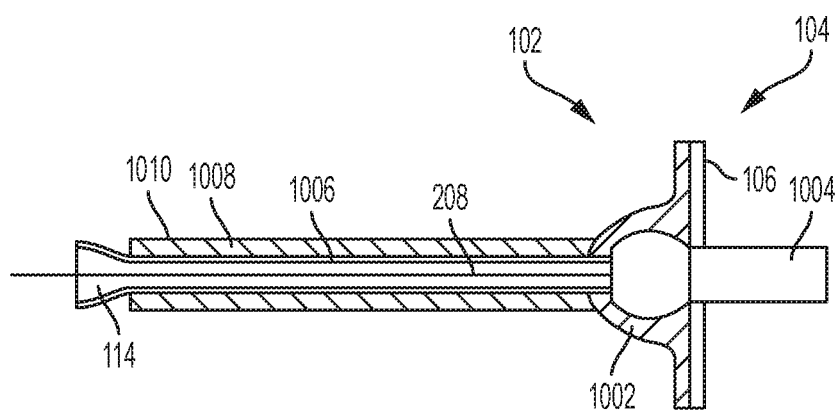
FIG. 17 is a schematic diagram of a feeder cable terminal, according to an exemplary embodiment.

FIG. 17 shows an example of such additional thermal insulation material in the form of an insulator element 1002 mounted on the thermal barrier 106 (such as, but not limited to the flange of a cryostat wall). The feeder cable 208 extends through the insulator element 1002, and is coupled to an electrically conductive rod or body 1004 that may be electrically coupled to the current lead 112 (not shown in FIG. 17) on the intermediate or higher temperature environment 104 side of the system.

Also FIG. 17 shows an example of such thermal insulation on the feeder cable 208, in the form of a thermal insulation cover 1006. The thermal insulation cover 1006 may include one or more layers, coatings or a hollow tube of thermal insulation material 1008, such as, but not limited to plastic, rubber, or the like. The thermal insulation cover 1006 may also include one or more layers, coatings or a hollow tube of electrical insulation material 1010 such as, but not limited to plastic, rubber, or the like. In certain examples, the thermal insulation cover includes a generally rigid or flexible hollow tube of thermal insulation material 1008 that has an inner wall that is coated with one or more layers of electrical insulation material 1006. In other examples, the feeder cable 208 is coated or otherwise provided with one or more outer layers electrical insulation material 1006, and is housed within a generally rigid or flexible hollow tube of thermal insulation material 1008. In yet other examples, one or more layers of the thermal insulation material 1008 is coated or layered onto the outer layer of electrical insulation material 1006 on the feeder cable 208.

Further examples of any of the systems described herein, or of other suitable superconducting power transmission or distribution systems, may be configured as hybrid systems with improved electrical stability, in the event of a failure of superconducting capabilities of one or more feeder cables 208 or the power cable 110. For example, failure of the cooling system for low temperature environment 102 or failure to sufficiently cool the warm end of the feeder cables 208 could drive the power cable 110 or the feeder cables 208 into their normal conducting states (out of a superconducting state). Other situations, such as, but not limited to a fault current exceeding the critical current of either the superconducting power cable, or the feeder cable, could drive them into their normal state.

Accordingly, further examples of any of the systems described herein may include a normal conducting electrical path (or backbone) that enables current to continue flowing, in the event of failure of one of the superconducting components. In particular examples, the normal conducting backbone may be connected in parallel to the superconducting power cable 110, but outside of the cryogenic environment 102 (outside of the cryostat). While the normal conducting backbone in other examples may be inside the cryogenic environment 102 (inside of the cryostat), certain advantages may be obtained by locating the normal conducting backbone outside of the cryogenic environment 102 (outside of the cryostat), including an ability to prevent additional heat load (from the flow of current in the normal conducting material of the backbone) from adversely affecting the ability of the cryogenic cooling system to bring the power cable 110 on the low temperature environment 102 side of the system, back to a superconducting operating temperature.

Figure 18:
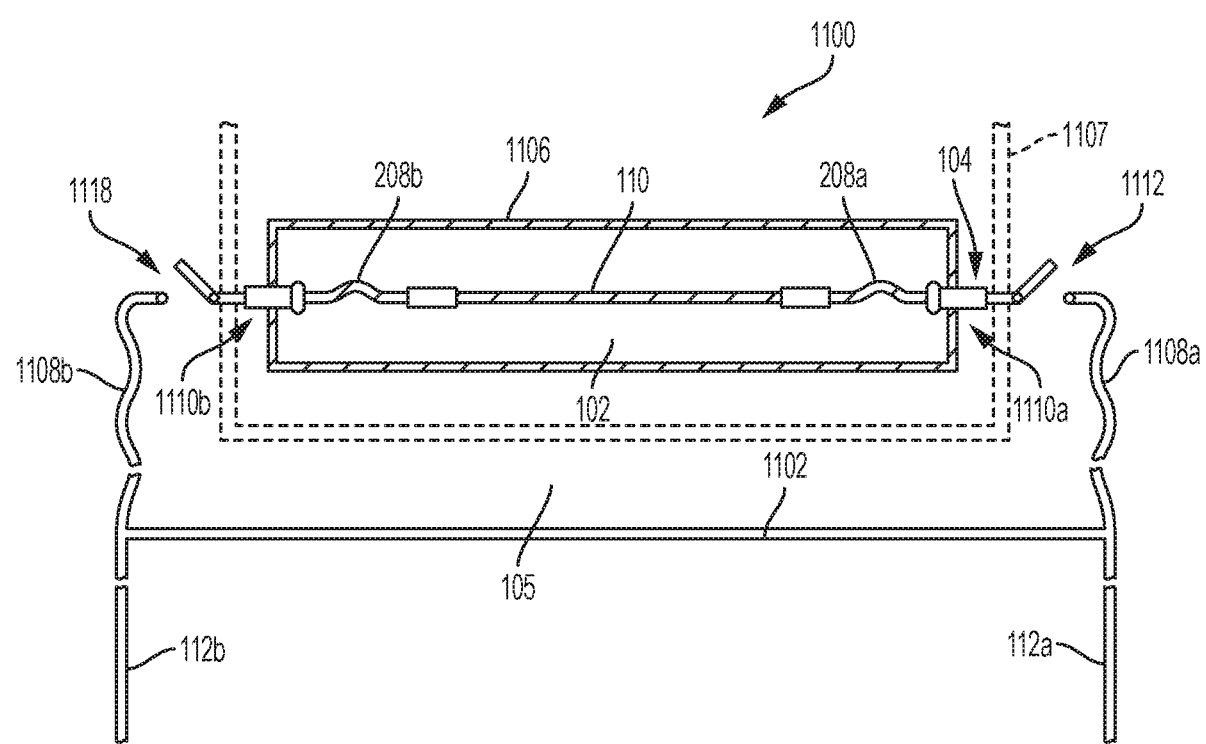
FIG. 18 is a schematic diagram of a system, according to an exemplary embodiment.

FIG. 18 shows an example of a system 1100 that includes a normal-conducting current path 1102 connected in parallel to superconducting feeder cables or wires 208a and 208b (such as, but not limited to CORC® feeder cables) and the superconducting power transmission or distribution cable 110, through normal conducting conductors 1108a and 1108b. The feeder cables or wires 208a and 208b may correspond to a feeder cable 208 as described herein. The feeder cables or wires 208a and 208b are coupled to the superconducting power cable 110, via connection terminals 114 that may correspond to any of the connection terminals described herein for connecting a terminal end of a feeder cable to a terminal end of a superconducting power transmission cable 110.

In FIG. 18, the superconducting feeder cables or wires 208a and 208b and the superconducting power transmission or distribution cable 110 are located within a low temperature environment 102 side of the system, for example, inside of a cryostat housing 1106. However, the normal-conducting current path 1102 is located in the higher-temperature or room temperature environment 105, outside of the cryostat housing 1106. In certain examples, an intermediate temperature environment 104 may be provided between the higher-temperature or room temperature environment 105 and the low temperature environment 102, and separated from the higher-temperature or room temperature environment 105 by a thermal barrier 1107 (shown in broken lines in FIG. 18), for example, but not limited to a second cryostat housing or second thermal barrier 107 as discussed above. In particular examples, the second thermal barrier 1107 may be located between a connector assembly 1110a and a first switch 1112, and between a connector assembly 1110b and a second switch 1118. In certain examples, the normal-conducting current path 1102 or shunt may be composed of a normal conducting electrical cable of electrically conductive material including, but not limited to copper or aluminum, and has a length section defining the current path 1102. The normal conducting electrical cable is coupled to the normal-conducting side of the connector assembly 1110a, through the first switch 1112. The opposite end of the length section of the normal conducting electrical cable is coupled to the normal-conducting side of the connector assembly 1110b, through the second switch 1118 in the intermediate temperature environment, or room temperature side of the system. The connector assemblies 1110a and 1110b may be configured similar to connector assemblies 910 described above, or other suitable connector terminal structure.

The switches 1112 and 1118 are located at room temperature, or at the intermediate temperature and may be one or more mechanical, electrical, solid state or processor operated switch. In particular examples, the switches 1112 and 1118 are controlled (for example, by suitable detection and processing electronics) to open and disconnect the current leads 112a and 112b, the superconducting feeder cables 208a and 208b and the superconducting power cable 110 from the normal conducting current path 1102, upon detection of a fault or other failure of the superconducting power cable 110 or feeder cables 208a and 208b. In particular examples, the normal conducting current path 1102 may be configured to operate at about the same voltage level as would the superconducting power cable 110 when no fault or failure occurred. In other examples, the connection of the connector assemblies 1110a and 1110b to the normal conducting current path 1102 is not made through a switch but, instead, is a direct connection.

In any of the examples described herein, further switches can be included, that disconnect the superconducting cable 110 from the normal conducting cable on one side or both sides of the superconducting cable, for example, upon or shortly after a fault or failure is detected. Electrical connection of the normal conducting current path 1102 is provided through normal conducting cables 112a and 112b. For example, processor controlled switches may be employed that selectively open or close, when the superconducting power cable fails, to provide current with the only option to flow being through the normal conducting current path 1102 that runs in parallel to the superconducting power transmission cable 110. In certain examples, the normal cable could allow a larger voltage to be generated over the cable system, lowering the overall current.

Figure 19:
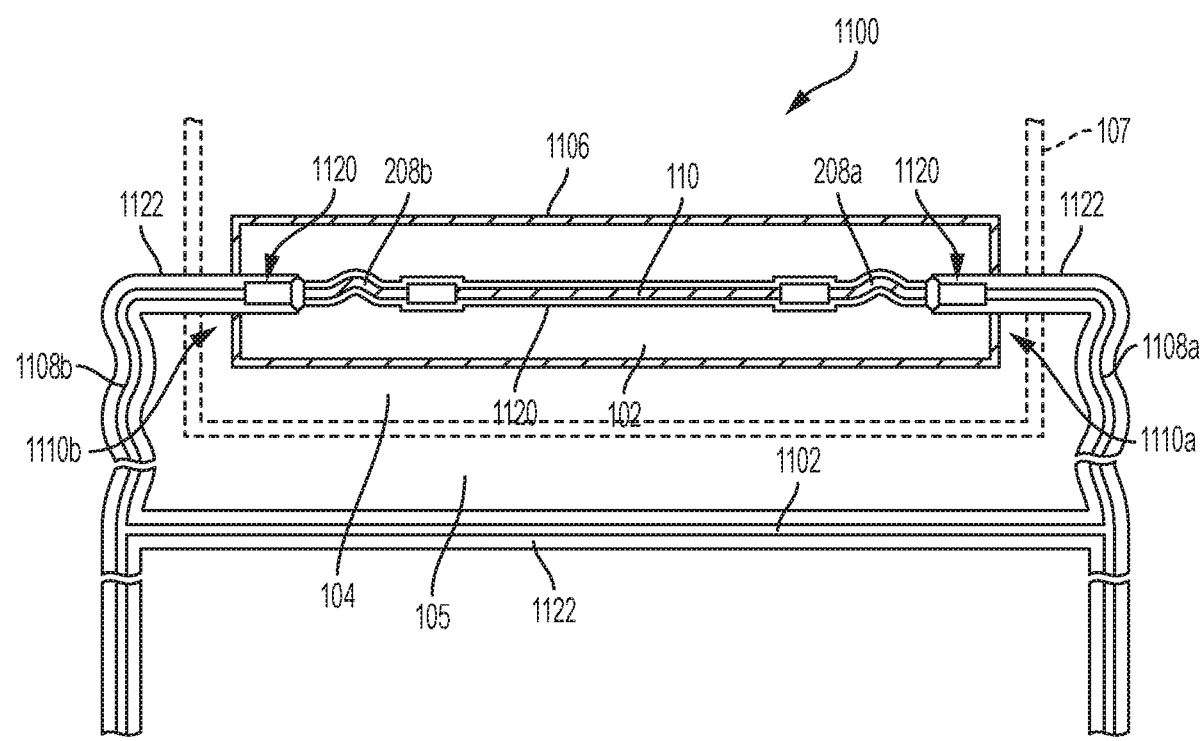
FIG. 19 is a schematic diagram of a system, according to an exemplary embodiment.

In any of the examples described above, a superconducting cable 110 disposed within a cryostat housing 1106 (defining a first thermal barrier) may include an electrical insulation material or cold dielectric layer 1120, as shown in FIG. 19. The cold dielectric layer 1120 may cover all electrically conductive components within the cryostat housing 1106, including feeder cables or wires 208a and 208b. On the other hand, components external to the cryostat housing 1106 (including normal conducting conductors 1108a and 1108b, normal conducting current path 1102 in an intermediate or higher temperature environment 104) may have an electrical insulation material composed of a warm dielectric layer 1122. A second thermal barrier 1107, shown in broken lines, (for example, but not limited to a second cryostat housing or a second thermal barrier 107 as discussed above) may be provided at or on the warm side of each of the connector assemblies 1110a and 1110b, to separate the intermediate or higher temperature environment 104 from yet a higher (such as, but not limited to room or ambient) temperature environment. Accordingly, the current lead sections 112a and 112b may include a warm dielectric layer 1122, while the feeder cables 208a and 208b may include a cold dielectric layer 1120.

Figure 20:
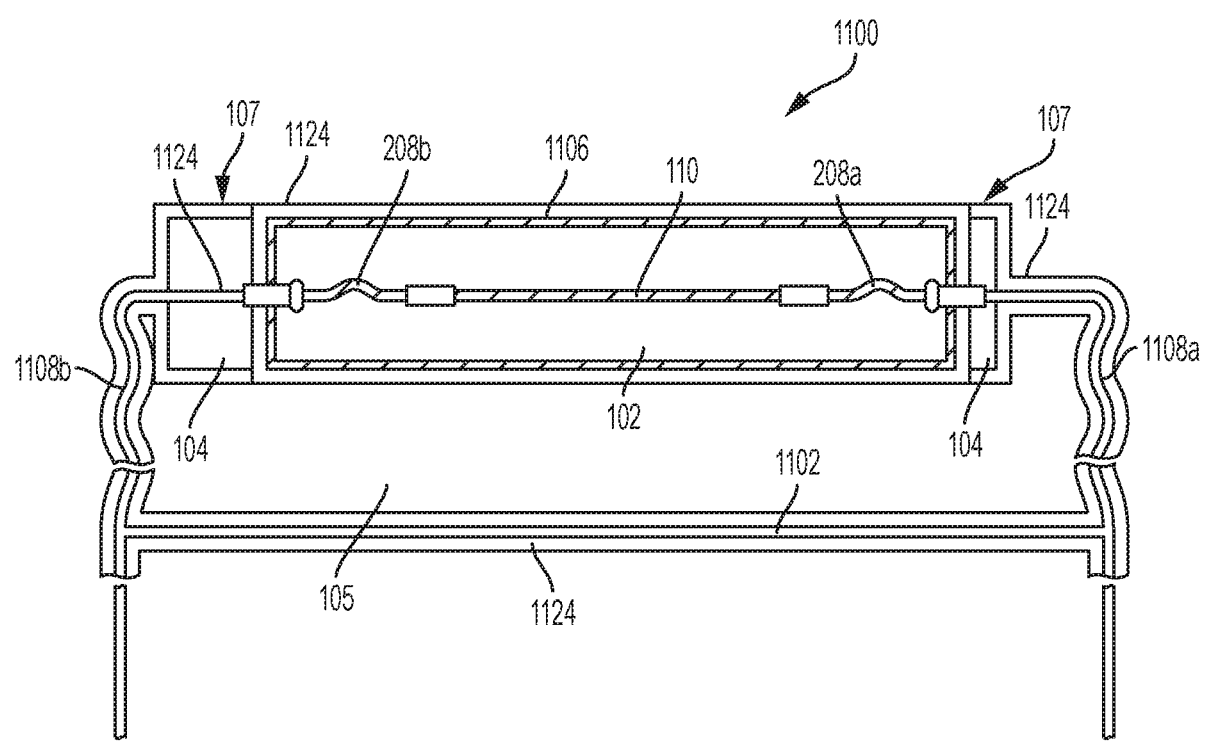
FIG. 20 is a schematic diagram of a system, according to an exemplary embodiment.

In further examples as shown in FIG. 20, instead of applying electrical insulation directly onto the CORC® feeder cables and the superconducting power transmission or distribution cable, an electrical insulation or dielectric material 1124 could be applied on the outside of the cryostat housing 107 in which they are housed. The cryostat and normal conducting cable will thus require only a dielectric that is not subjected to cryogenic temperatures (warm dielectric), which significantly reduces the technical challenge associated with a dielectric that is exposed to cryogenic temperatures (cold dielectric). Additionally, the dielectric would not be exposed to helium gas, which has the tendency to significantly reduce the strength of the dielectric material. This option does only allow one electrical phase to be present within the cryostat because everything located within the cryostat is at the same voltage. A multi-phase power transmission or distribution cable would thus be formed by several cryostats containing a warm dielectric and only one superconducting cable per cryostat.

Superconducting power cables are typically designed for the rated current in which the superconducting cable and the feeders have the capability to carry the current for an appropriate period of time. Normal conducting current leads that connect the feeder cables at the intermediate temperature (such as, but not limited to 77 K) to the power source or other equipment at room temperature should also be rated at this current. The cross-section size and other electrical parameters of the normal conducting current lead should thus be sufficient to allow the relatively high current to flow, while generating minimal or a suitably limited amount of resistive heating to reduce the burden on the cryogenic cooling equipment. The design of the current lead may be selected to reduce or minimize the resistive load generated by the operating current and the conductive heat along the current lead.

During certain events, the current carried by the power transmission or distribution cable may be far less than its operating current, while in other circumstances no current may be flowing at all for certain time durations. However, the conductive heat load through the current leads on the cryogenic system remains, even when no current is flowing. Methods to reduce the conductive heat load through the current leads when a current significantly lower than the rated current is flowing include providing a current lead having a cross-section, or effective length, that can be varied dynamically. At lower currents, the cross-section may be reduced, resulting in a reduced conductive heat load on the cryogenic system.

Figure 21:
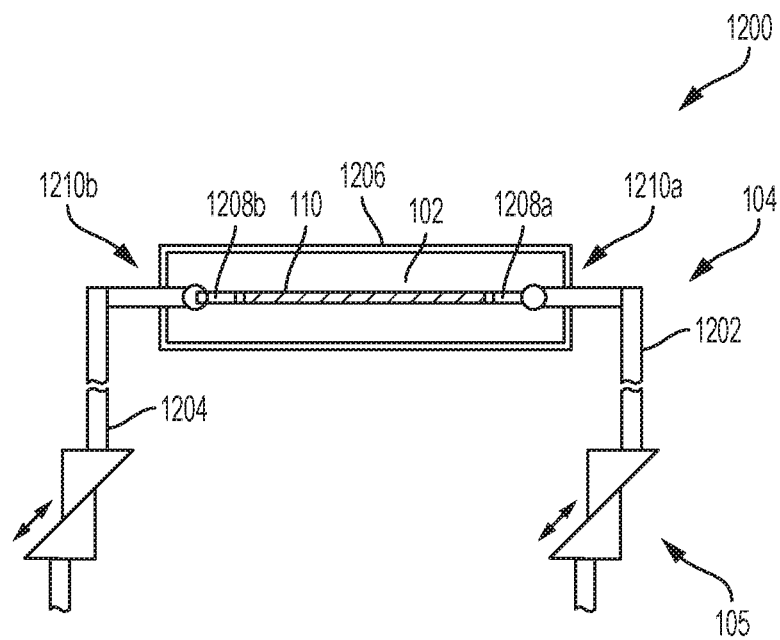
FIG. 21 is a schematic diagram of a system, according to an exemplary embodiment.

Accordingly, in further embodiments of any of the systems described herein, one or more variable load current leads may be included, to connect the feeder cables or wires to the power source or other equipment at room temperature, as shown in FIG. 21. In particular, FIG. 21 shows an example of a system 1200 that includes normal conducting, variable load current leads 1202 and 1204. The system 1200 includes the power transmission or distribution cable 110 in a low temperature environment region 102 of the system, for example, within a cryostat 1206 similar to the cryostat 1106 and corresponding to the thermal barrier 106 described herein. Feeder cables or wires 1208a and 1208b (such as, but not limited to CORC® feeder cables) connect to the terminal ends of the power transmission cable 110, as described herein. The feeder cables or wires 1208a and 1208b also connect to the variable load current leads 1202 and 1204, respectively, through suitable feeder cable connector assemblies 1210a and 1210b, respectively. Each of the feeder cables or wires 1208a and 1208b may correspond to a feeder cable 208 (or any of 208a-b, 308a-b, or 408a-c) as described herein. Each of the connector assemblies 1210a and 1210b may correspond to connector assembly 210 (or any of 310, 410a-c, 910, or 1110a-b), as described herein.

Each variable load current lead 1202 and 1204 is configured to have a variable current rating for proper operation over the time of expected use. Incorporating such variable load current leads into the power transmission system that contains superconducting feeder cables (such as, but not limited to a CORC® feeder cables) and a superconducting power transmission or distribution cable, as shown in FIG. 21 can provide a versatile power transmission or distribution system in which the overall heat load on the cryogenic system is minimized. The variable load current leads 1202 and 1204 may be configured in any suitable manner, including, but not limited to configurations for selectively changing the effective cross-section of normal conducting current leads. For example, a section of the current lead 1202 or 1204 may contain a plurality of sub-leads or conductive elements that can be selectively engaged or disengaged (mechanically, electrically or hydraulically) with the current lead (in parallel with or in place of a section of the current lead), to selectively increase or reduce the effective cross-section of the current lead. In certain examples, a variable load current lead includes a plurality of parallel conductive elements comprising metal cylinders (e.g., of the same, similar or different shape, form, or material), such as, but not limited to the configuration described in U.S. Patent Application Publication No. 2017/0025850 A1 (to Christopher Rey, titled "Intelligent Current Lead Device And Operational Methods Thereof"), which is incorporated herein by reference, in its entirety.

In configurations, having such variable load current leads, one or more conductive elements may be controlled to become engaged to provide a portion of the conductive path of the current lead when the current to the device increases, or one or more conductive elements may be controlled to become disengaged from the conductive path when the current decreases. In other examples, the variable load current leads 1202 and 1204 may have other suitable configurations including, but not limited to, a screw-type current lead configuration in which the effective cross-section (and current rating) of the current lead is determined by the length over which the screw is engaged in a threaded, conductive receptacle, which can provide a relatively precise control of the current rating and effective cross-section of the lead.

Figure 22:
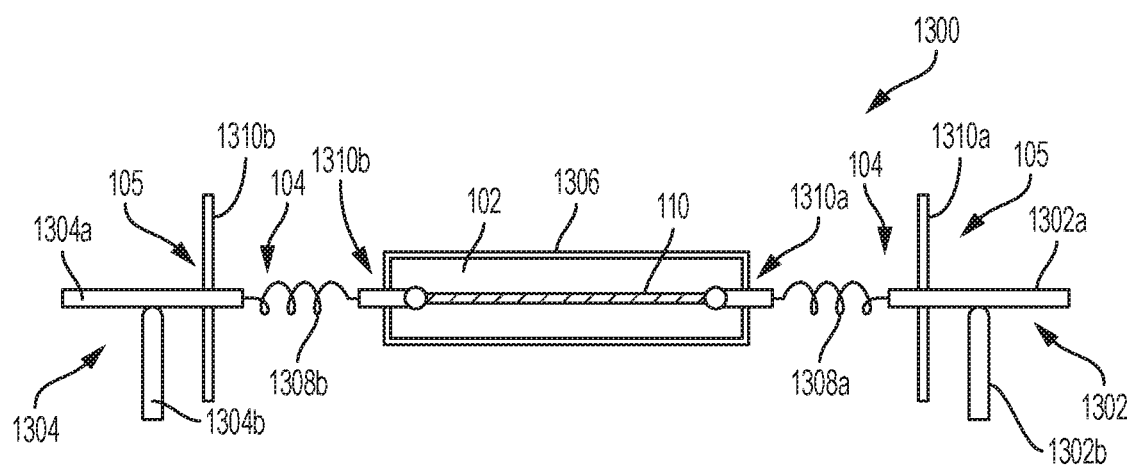
FIG. 22 is a schematic diagram of a system, according to an exemplary embodiment.

In further embodiments of any of the systems described herein, one or more current leads that connect the feeder cables or wires to the power source or other equipment located at room temperature, may be configured to selectively vary heat conduction properties by, for example, but not limited to, selectively varying the length of the current lead. In particular, FIG. 22 shows an example of a system 1300 that includes variable length current leads 1302 and 1304. The system 1300 includes the superconducting power transmission cable 110 in a low temperature environment region 102 of the system, for example, within a cryostat 1306 similar to the cryostat 1106 and corresponding to the thermal barrier 106 (or 1106) described herein.

Superconducting feeder cables or wires 1308a and 1308b (such as, but not limited to CORC® feeder cables) connect to the terminal ends of the superconducting power cable 110, via connector assemblies as described herein or other suitable connectors. The feeder cables or wires 1308a and 1308b are also coupled to a respective variable length current lead 1302 and 1304, through a respective connector assemblies 1310a and 1310b. The variable length current leads 1302 and 1304 couple the feeder cables or wires 1308a and 1308b (in an intermediate temperature environment region 104) to the power source or other equipment in a room temperature environment 105. Each of the feeder cables or wires 1308a and 1308b may correspond to a feeder cables 208 (or any of 208a-b, 308a-b, 408a-c, or 1208a-b) as described herein. Each of the connector assemblies 1310a and 1310b may correspond to connector assemblies 210 (or any of 310, 410a-c, 910, 1110a-b or 1210a-b), as described herein.

Each variable length current lead 1302 and 1304 includes a conductive lead section 1302a, 1304a, and a conductive sliding contact 1302b, 1304b, arranged for relative sliding movement between the conductive lead section and the conductive sliding contact. For example, the conductive sliding contact 1302b, 1304b may be supported for sliding movement while remaining in contact with the conductive lead section 1302a, 1304a, to be selectively slid in a direction of the length dimension of the conductive lead section 1302a, 1304a, to effectively change the length of the electrical conduction path through the conductive lead section 1302a, 1304a and the conductive sliding contact 1302b, 1304b. In a further example, the conductive sliding contact 1302b, 1304b is supported in a fixed position, while the conductive lead section 1302a, 1304a is supported for controlled, selective movement in a direction of its length dimension. Accordingly, the relative position of the conductive sliding contact 1302b, 1304b along the length dimension of the conductive lead section 1302a, 1304a may be controlled and selected, to control and select a desired effective length of the conduction path.

In the system 1300, the conductive lead section 1302a, 1304a extends through an opening in a second thermal barrier 1310a and 1310b. In certain examples, the second thermal barrier 1310a or 1310b may be a wall of a second cryostat such as, but not limited to, a helium gas-filled cryostat, or a vacuum containing cryostat, having an intermediate temperature in the range of 65-90 K (such as, but not limited to 77K). The second thermal barrier 1310a or 1310b separates an intermediate temperature environment 104 side of the system 1306 from a room temperature environment 105 side of the system 1300. In certain examples, the conductive lead section 1302a, 1304a may include a generally rigid shaft, rod or other length of electrically conductive material, that extends through the second thermal barrier 1310a or 1310b and has a first end on an intermediate temperature environment 104 side of the second thermal barrier 1310a or 1310b, and a second end on a room temperature environment 105 side of the second thermal barrier 1310a or 1310b. The first end of each conductive lead section 1302a, 1304a is coupled to a terminal end of a feeder cable or wire 1308a, 1308b. In certain examples, each feeder cable or wire 1308a, 1308b may be provided with one or more loops, coils, bends or other configuration that provides sufficient slack to allow the conductive lead section 1302a, 1304a, to be selectively moved in a length dimension of the conductive lead section 1302a, 1304a, as described herein.

The second end of the each conductive lead section 1302a, 1304a may remain open or unconnected to a further lead (or, alternatively, may be connected to another normal conducting lead, not shown). However, the conductive sliding contact 1302b, 1304b makes an electrical connection (by contact) with the conductive lead section 1302a, 1304a, at a location along the length of the conductive lead section 1302a, 1304a that corresponds to the sliding position of the conductive sliding contact 1302b, 1304b. In particular examples, the movement of the conductive sliding contact 1302b, 1304b or the conductive lead section 1302a, 1304a is controlled by a processor-based control system (not shown) coupled to the conductive sliding contact 1302b, 1304b or the conductive lead section 1302a, 1304a, and capable of selectively moving the conductive sliding contact 1302b, 1304b or the conductive lead section 1302a, 1304a relative to each other.

In certain examples, the conductive lead section 1302a, 1304a are constructed from a material with relatively low thermal conductivity and likely relatively low electrical conductivity, such as, but not limited to metal alloys, such as brass or other copper alloys. By controlling the relative sliding motion of the conductive sliding contact 1302b, 1304b and the conductive lead section 1302a, 1304a, the thermal conduction of the variable length current lead 1302, 1304 can be controlled. For example, a longer effective length of the current lead 1302, 1304, can reduce thermal conduction, relative to a shorter effective length. In certain examples, the effective cross-section of the conductive lead section 1302a, 1304a may be smaller toward the second end of the conductive lead section 1302a, 1304a, relative to the first end, to reduce the effective thermal conduction of the conductive lead section 1302a, 1304a, toward the second end of the lead section.

In certain examples, the conductive sliding contact 1302b, 1304b may include a generally rigid shaft, rod or other length of electrically conductive material, that has a first end supported and arranged to contact (for relative sliding motion) the conductive lead section 1302a, 1304a, as described herein. Each conductive sliding contact 1302b, 1304b has a second end that is electrically coupled to a normal-conducting cable or wire, such as, but not limited to the normal-conducting cable or wire that is electrically connected to the power source or other equipment at room temperature (not shown in FIG. 22).

In the system 1300 of FIG. 22, the relative position of the conductive sliding contact 1302b, 1304b and the conductive lead section 1302a, 1304a, may be selected (by sliding motion as described herein) and a current may be injected into the portion of the sliding contact that is located at or near room temperature environment 105 side of the system 1300. In other examples, other suitable variable length current lead configurations may be employed as the variable length current leads 1302 and 1304. In examples that include one or more variable length current leads, the effective heat conduction may be controlled and changed by selectively varying the length of the current lead. For example, the length of the current may be controlled to be reduced when the current increases, and the length of the current may be increased when the current is reduced.

In further embodiments of any of the systems described herein, a cooling device may be provided to cool an end of one or more of the feeder cables or wires. In certain example, the cooling device may include any suitable device that cools an end of the feeder cable to a temperature corresponding to the temperature of the low temperature environment 102, the temperature of the intermediate environment 104, or a temperature between that of the low temperature environment 102 and the intermediate temperature environment 104. Such a cooling device may include, but is not limited to, a heat exchanger through which a cryogenic liquid or gas flows, a cryocooler that cools the end of the feeder cable at the low or the intermediate temperature directly through conduction, or a bath of liquid cryogen.

In certain examples, the cooling device includes a heat exchanger having one or more passages through which a coolant may flow, where the coolant may be, for example, a cryogenic gas or liquid. In particular examples, the coolant flow passages of the heat exchanger are coupled in fluid flow communication with the low-temperature environment 102 side of the system where the superconducting power transmission cable 110 is located. In other examples, coolant flow passages of the heat exchanger are coupled in fluid flow communication with another source of cryogenic fluid, such as an external source.

Figure 23:
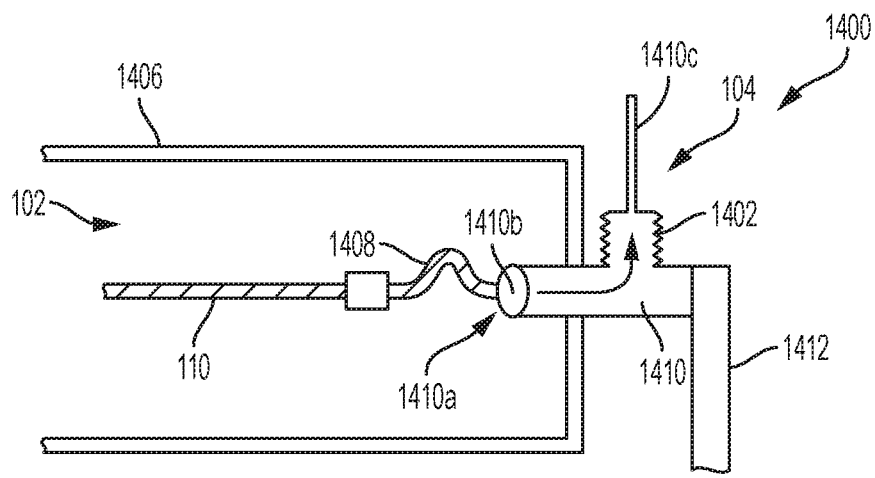
FIG. 23 is a schematic diagram of a system, according to an exemplary embodiment.

In the system 1400 of FIG. 23, a heat exchanger 1402 is coupled to (or is configures as part of) a superconducting feeder cable connector terminal 1410, that connects a feeder cable 1408 to a normal conducting current lead 1412. In FIG. 23, the feeder cable 1408 may be, but is not limited to a CORC® feeder cable or wire (e.g., corresponding to 208, 208a-b, 308a-b, 408a-c, 1208a-b, or 1308a-b) as described herein. The connector terminal 1410 may correspond to a connector terminal 210 (or any of 310, 410a-c, 910, 1110a-b, 1210a-b or 1310a-b), as described herein, but with a heat exchanger as described herein. The normal conducting current lead 1412 may correspond to a normal conducting lead 112, 1112, 1108a, 1202 or 1204, as described herein.

The connector terminal 1410 includes a fluid or gas inlet port 1410a that has an open end, in fluid or gas flow communication with the low temperature environment 102 (for example, within the interior of a cryostat 1406). The connector terminal 1410 also includes in internal channel 1410b and a fluid outlet port 1410c through which fluid entering the inlet port 1410a may flow and exit. In particular examples, the feeder cable may extend into the fluid inlet port 1410a and at least partially through the internal channel 1410b of the connector terminal 1410, to electrically couple to the current lead 1412. Accordingly, cryogenic fluid from the low temperature environment 102 may flow into the same inlet port and channel through which the terminal end portion of the feeder cable 1408 extends. The cryogenic fluid may exit the heat exchanger, through the outlet port 1410c. The heat exchanger may be formed with a suitable material, surface area and configuration (including fins or other features) to enhance removal of heat from the connector terminal 1410.

Figure 24:
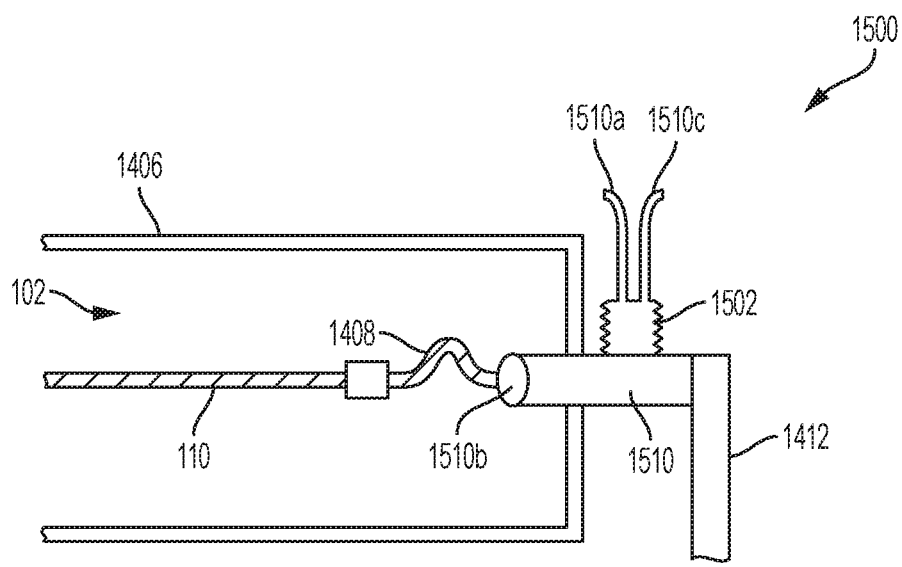
FIG. 24 is a schematic diagram of a system, according to an exemplary embodiment.

The system 1500 in FIG. 24 is similar to the system 1400 described above, but includes a connector terminal 1510 having a heat exchanger 1502 that has a cryogenic fluid or gas inlet port 1510a located external to the low temperature environment 102 (e.g., external to the cryostat 1406), and a separate feeder cable inlet and channel 1510b that is open to the low temperature environment 102. The heat exchanger configuration includes a cryogenic fluid or gas outlet port 1510c, similar to the outlet port 1410c in FIG. 23. The cryogenic fluid inlet port 1510a may be coupled, through a suitable conduit, to a cryogenic fluid source. In particular examples, the cryogenic fluid source may be the low temperature environment 102. In those examples, the conduit coupled to the inlet port 1510a may connect, at a further end, to a fluid outlet port (not shown) on the cryostat 1406. In other examples, the conduit coupled to the inlet port 1510a may be connected, at a further end, to another suitable source of cryogenic fluid, such as an external source.

Figure 25:
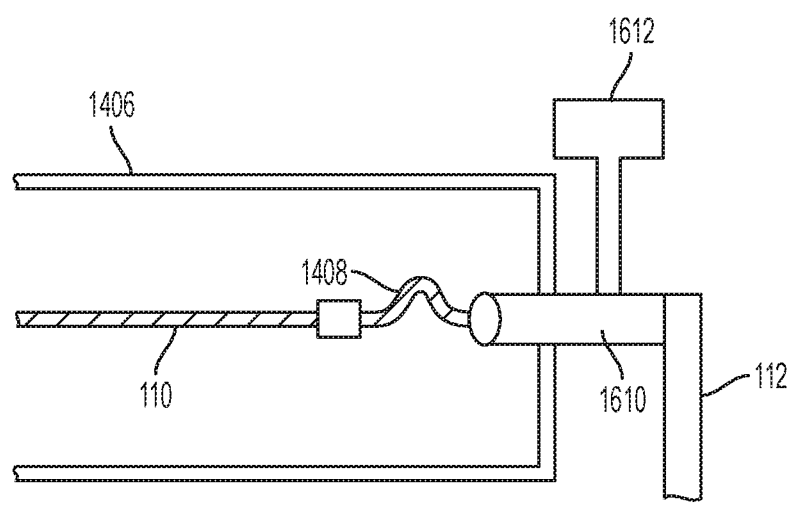
FIG. 25 is a schematic diagram of a system, according to an exemplary embodiment.

In the examples in FIGS. 23 and 24, the heat exchanger portion of connector terminal 1410, 1510, may include any suitable configuration for enhancing cooling of the terminal end portion of the feeder cable within the connector terminal 1410, 1510, while minimizing or inhibiting a drop of pressure in the cryogenic fluid. In certain examples, the heat exchanger may include a porous metal foam that is mounted onto the terminal end portion of the feeder cable located within the passage 1410b, 1510b through which cryogenic fluid may flow. In those or other examples, the heat exchanger may include metal fins machined or attached to the feeder cable terminal or other structure in direct contact with the feeder terminal, such as the rod or tube 119 in which the feeder terminal is mounted. In further examples, a connector terminal 1610 includes a heat exchanger comprising a cryocooler 1612 arranged in direct (or suitable thermal conductive) contact with the connector terminal similar to connector terminal 911, as described herein), as shown in FIG. 25.

The heat exchanger may be mounted onto the warm end of the feeder cable where the normal conducting current lead attaches, or to other parts of the feeder cable or normal conducting current lead. In further examples, multiple heat exchangers may be mounted at different locations along the feeder cable, such as both the warm end as well as the cold end of the connector terminal 1410, 1510.

In operation, power transmission or distribution systems can experience faults such as over currents that exceed the current rating of the power cable, feeder cables, or both. These overcurrent events could potentially damage an application powered by the power transmission system. However, in further examples of any of the systems described herein, superconductors in the system can offer the benefit of acting as fault current limiting (FCL) devices that can limit the overcurrent and protect the equipment that is powered. In such further examples, if the overcurrent exceeds the critical current of the superconducting cable or feeder, that cable or feeder rapidly returns to its normal state. In particular, current in the superconductor is transferred into a normal conducting, stabilizing material such as, but not limited to, the layer of copper plating on REBCO tapes or the normal conducting former in CORC® cables, which results in a rapid buildup of voltage over the length of the superconductor, limiting the fault current.

Fault current limiting devices or cables that use high-temperature superconductors typically require sufficient normal conducting material in parallel to the superconducting tape. Resistive laminates may be soldered or bonded to the surface of the superconducting tape, to prevent local burnout at hot spots in case the superconducting film has areas with reduced critical current. Current can bypass these areas with reduced performance in case of a fault current. However, the additional stabilizing material in parallel to the superconducting tape can make the tapes less flexible and result in a slower and less effective reaction of the FCL device, due to the normal state resistivity of the tape being relatively low. Also, the heat capacity can be much higher compared to tapes without laminates.

Accordingly, certain examples described herein may include CORC® cables and wires in which many superconducting tapes (such as, but not limited to REBCO tapes) are wound with short twist pitches of, for example, between 3 and 30 mm, into multiple layers with alternating winding direction in adjacent layers results in a relatively high level of current sharing between tapes. A CORC® wire may contain any suitable number of layers and tapes per layer such as, but not limited to four tapes per layer, in which each tape is in direct contact with a relatively large number of neighboring tapes per twist pitch. The high level of current sharing between tapes in CORC® cables and wires can remove the need for resistive laminates or other mechanisms of providing normal current paths to bypass local defects in the tape when used as FCL device. Accordingly, CORC® FCL cables or wires can remain flexible, and contain a relatively low amount of normal conducting material.

The relatively high normal state resistivity and low thermal capacity of the CORC® cable or wire can allow a very fast voltage buildup during over current events, while minimizing the risk of local burnout. At the same time, the voltage per unit length over the CORC® FCL cable or wire can be relatively high, resulting in better current blocking performance at shorter conductor length.

In particular examples of superconducting power cable systems as described herein (or other suitable systems), a CORC® power transmission or distribution cable 110 or one or more CORC® feeder cables or wires may be configured to act as a fault current limiting device. The system may be configured such that the longer power transmission cable acts as an FCL cable during a fault, or such that one or more of the CORC® feeder cables act as an FCL device. One benefit of having one or more of the CORC® feeders act as FCL device may be that they may help protect the much longer and more expensive power transmission cable from over current faults. Also, CORC® feeders may be located at the ends of the cryostat in which the longer power transmission cable is housed, making it much easier to replace them in case they fail during an over current event. Also, a much higher cooling power may be available at the warmer end of the CORC® feeders, compared to the cooling power available to the much longer CORC® power transmission cable that operates at lower temperature, which can result in a much faster cool down of the CORC® feeder cables after a fault has cleared. In addition, the superconducting power cable may contain a larger amount of normal stabilizing material to provide a larger margin against local temperature fluctuations or other instabilities that might be expected during normal operation.

In further examples, a power transmission system may include a CORC® power transmission or distribution cable and one or more (or each) CORC® feeder cable or wires, each configured to act as FCL device. This allows for much higher voltages to buildup during a fault due to the longer length of the power transmission cable compared to the feeder cables. In particular examples, the feeder cables contain a lower amount of normal conducting material than the power cable per unit length, thereby reacting to the overcurrent event much faster. The power cable would respond at a slower rate, resulting in a higher overall voltage over the power transmission or distribution system over time, in case the voltage over generated by the CORC® feeders is insufficient to reduce the fault current.

In particular examples, CORC® feeder cables or wires have an increased or selected length to further increase the overall voltage generated by an over current fault. An increased length of CORC® cable or wire in the feeder may be contained in a relatively small compartment at the ends of the cryostat in which the power transmission cable is housed, by for instance winding the CORC® feeder cable or wire into a coil, or bifilar coil configuration. Confining the CORC® FCL feeder cable or wire in a relatively small volume also has the benefit that it may be cooled more effectively, reducing the time needed to bring the temperature down to its normal range after a fault has cleared.

Figure 26:
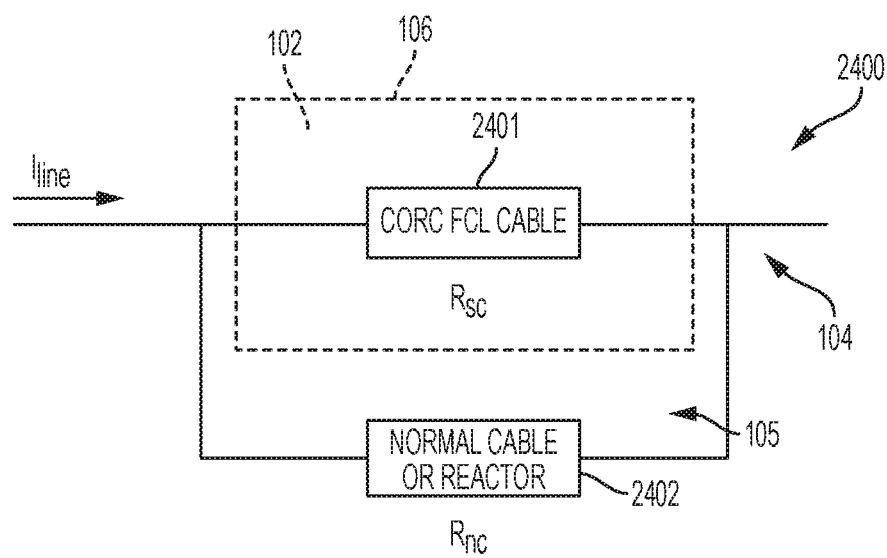
FIG. 26 is a schematic diagram of a system, according to an exemplary embodiment.

In further examples, a power transmission or distribution system 2400 may include one or more of the components 2401 of the superconducting system (e.g., a power transmission or distribution cable or one or more feeder cables or wires), each configured to act as FCL device, and a normal conducting cable 2402 outside of the cryogenic environment 102, such as shown in FIG. 26. In a system 2400, a percentage of the current in the superconducting power cable system would be automatically transferred into the normal cable 2402 during a fault. This can limit the current in the superconducting system 2401, protecting the superconductors and making it easier to disconnect the superconducting system 2401 using a mechanical or other type of switch or breaker.

Further embodiments relate to methods of making and using any of the systems described herein. In particular, example methods of making any of the systems described herein include connecting one or more feeder cables to a superconducting power transmission or distribution cable in a low-temperature or cryogenic environment, through a connection assembly such as, but not limited to those described herein. In particular examples of such methods, the superconducting power cable or the one or more feeder cables (or all of those cables) are CORC® cables or wires. Such methods further include connecting the one or more feeder cables to a normal conducting current lead, through a connection terminal such as, but not limited to those described herein, where the normal conducting current lead is in an intermediate or higher temperature environment. Certain embodiments further include connecting a normal conducting cable in parallel with the superconducting power cable, but outside of the low-temperature or cryogenic environment. Certain embodiments further include configuring one or more of the superconducting power transmission or distribution cable or the feeder cables to perform as an FCL device. Example methods of using any of the systems described herein include configuring the system and injecting a current into the superconducting power cable, through the normal conducting current lead, and communicating the current through the superconducting power cable to a power consuming application. Further examples include extracting current from the superconducting power cable, through the normal conducting current lead, and providing extracted current to a current-consuming application. In certain examples, the majority (or all) current is injected (or extracted) into the superconducting feeder cable or wire from the normal current lead located outside of the low-temperature environment (such as a closed cryogenic vessel) in which the superconducting power cable is located.

The order or sequence of any process or method steps may be varied or re-sequenced according to alternative embodiments. Other substitutions, modifications, changes and omissions may also be made in the design, operating conditions, and arrangement of the various exemplary embodiments without departing from the scope of the present invention.

The construction and arrangement of the elements as shown in the exemplary embodiments are illustrative only. Although embodiments of the present disclosure have been described in detail, those skilled in the art who review this disclosure will readily appreciate that many modifications are possible (e.g., variations in sizes, dimensions, structures, shapes, and proportions of the various elements, values of parameters, mounting arrangements, use of materials, orientations, etc.) without materially departing from the novel teachings and advantages of the subject matter recited. For example, elements shown as integrally formed may be constructed of multiple parts or elements.

What is claimed is:

1. A superconducting power cable system comprising:
   a superconducting power cable in a first temperature environment;
   a thermal barrier separating the first temperature environment from a second temperature environment, the second temperature environment being at a higher temperature than the first temperature environment, the second temperature being low enough to sustain superconductivity;
   at least one superconducting feeder cable having a first end electrically coupled to the superconducting power cable in the first temperature environment, each superconducting feeder cable having a second end electrically coupled to a normal conducting current lead in the second temperature environment, wherein each superconducting feeder cable includes a superconducting material that is configured to conduct current in a superconducting state such that at least a majority of the current is conducted to or from the first temperature environment in the superconducting state;
   wherein the first temperature environment contains a cryogenic medium, and the second temperature environment is free of cryogenic medium in contact with the at least one superconducting feeder cable.

2. A system as recited in claim 1, wherein the first temperature environment comprises an interior of a cryostat, and wherein the thermal barrier comprises a wall of the cryostat.

3. A system as recited in claim 1, wherein the second temperature environment is within an interior of a cryostat, and wherein the cryostat includes a second thermal barrier that separates the second temperature environment from a third temperature environment.

4. A system as recited in claim 1, wherein each superconducting feeder cable extends through the thermal barrier.

5. A system as recited in claim 1, wherein each superconducting feeder cable comprises a flexible superconducting cable or wire formed of multiple superconducting tapes that are wound in a helical fashion and in multiple layers around a round former.

6. A system as recited in claim 1, further comprising a feeder cable terminal electrically connected to the second end of each superconducting feeder cable and to the normal conducting current lead, to electrically couple the second end of each superconducting feeder cable to the normal conducting current lead.

7. A system as recited in claim 6, further comprising a heat exchanger or a cryocooler coupled to the feeder cable terminal.

8. A system as recited in claim 6, wherein the feeder cable terminal comprises a tubular structure extending through the thermal barrier and having an open end opening into the first temperature environment, the open end for receiving a cooling fluid from the first temperature environment, the tubular structure having a conductive section electrically connected to the second end of each superconducting feeder cable.

9. A system as recited in claim 6, wherein the feeder cable terminal comprises a tubular structure extending through the thermal barrier and having an open end opening into the first temperature environment, and a closed end in the second temperature environment, the tubular structure having a passage extending from the open end toward the closed end, wherein the at least one superconducting feeder cable extends through the open end of the tubular structure and at least partially into the passage of the tubular structure.

10. A system as recited in claim 9, wherein the tubular structure is electrically conductive and is electrically connected to the second end of the superconducting feeder cable and to the normal conducting current lead, to electrically couple the second end of the superconducting feeder cable to the normal conducting current lead.

11. A system as recited in claim 9, wherein the tubular structure is electrically insulating and is structurally connected to the second end of the feeder cable terminal, which is electrically connected to the normal conducting current lead.

12. A system as recited in claim 10, wherein the feeder cable terminal further comprises a ceramic thermal insulator disposed between the tubular structure and the thermal barrier.

13. A system as recited in claim 1, further comprising a connector terminal in the first temperature environment and electrically connected to the first end of each superconducting feeder cable and a terminal end of the superconducting power cable, to electrically couple each superconducting feeder cable to the superconducting power cable.

14. A system as recited in claim 1, further comprising a plurality of feeder cable terminals, each feeder cable terminal extending through the thermal barrier and being electrically connected to the second end of a respective one of the superconducting feeder cables and to the normal conducting current lead, to electrically couple the second end of the respective one of the superconducting feeder cables to the normal conducting current lead.

15. A system as recited in claim 1, wherein each superconducting feeder cable has at least one of a bend, loop or spiral, to provide slack between the first end and the second end of the superconducting feeder cable.

16. A system as recited in claim 1, further comprising at least one normal conducting electrical conductor coupled in parallel with the superconducting power cable and located outside of the first temperature environment.

17. A system as recited in claim 1, wherein the first temperature environment comprises an interior of a cryostat, the system further comprising at least one normal conducting electrical conductor coupled in parallel with the superconducting power cable and located outside of the cryostat.

18. A system as recited in claim 1, wherein:
the first temperature environment comprises an interior of a cryostat;
the superconducting power cable has a first terminal end and a second terminal end within the cryostat;
the at least one superconducting feeder cable comprises a first superconducting feeder cable electrically coupled to the first terminal end of the superconducting power cable, and a second superconducting feeder cable electrically coupled to the second terminal end of the superconducting power transmission cable, a power source or a power load;
the system further comprising:
  a first feeder cable terminal assembly extending through a wall of the cryostat and being electrically connected to the first superconducting feeder cable and to a first normal conducting current lead; and
  a second feeder cable terminal assembly extending through a further wall of the cryostat and being electrically connected to the second superconducting feeder cable and to a second normal conducting current lead.

19. A system as recited in claim 18, wherein at least one of the first and second normal conducting lead comprises a variable load current lead.

20. A system as recited in claim 1, wherein the at least one superconducting feeder cable includes a first and a second superconducting feeder cable, where the superconducting material in each of the first and second superconducting feeder cables comprises a superconducting material that operates in a superconducting state at the second temperature in the second temperature environment.

21. A system as recited in claim 1, wherein each of the superconducting feeder cables includes a plurality of superconducting tapes that operate in a superconducting state at the second temperature, and wherein the superconducting power cable is configured to operate in a superconducting state at the first temperature.

22. A system as recited in claim 1, wherein the second temperature environment contains a vacuum.

23. A superconducting power system comprising:
a superconducting power cable in a closed first temperature environment that is cooled with a cryogenic media to a first cryogenic temperature sufficiently low to sustain superconductivity in the superconducting power cable;
a thermal barrier separating the closed first temperature environment from at least one of a first volume adjacent a first end of the superconducting power cable and a second volume adjacent a second end of the superconducting power cable, each of the first and second volumes being at a second cryogenic temperature that is higher than the first cryogenic temperature;
at least one first superconducting feeder cable and at least one second superconducting feeder cable, wherein the second cryogenic temperature is sufficiently low to sustain superconductivity in the first and second superconducting feeder cables;
wherein each of the first and second superconducting feeder cables includes a superconducting material and is configured to conduct current in a superconducting state to or from the superconducting power cable in the second cryogenic temperature; and wherein:
the at least one first superconducting feeder cable has a cold terminal end coupled to the first end of the superconducting power cable in the closed first temperature environment, the at least one first superconducting feeder cable extending from the first end of the superconducting power cable, through the thermal barrier, to the first volume, the at least one first superconducting feeder cable having a warm terminal end coupled to a normal conducting current lead in the first volume, and the first volume is free of cryogenic media in contact with the at least one first superconducting feeder cable; or
the at least one second superconducting feeder cable has a cold terminal end coupled to the second end of the superconducting power cable in the closed first temperature environment, the at least one second superconducting feeder cable extending from the second end of the superconducting power cable, through the thermal barrier, to the second volume, the at least one second superconducting feeder cable having a warm terminal end coupled to a further normal conducting current lead in the second volume.

24. A system as recited in claim 23, wherein each of the first and second superconducting feeder cables comprises a flexible superconducting cable or wire formed of multiple superconducting tapes that are wound in a helical fashion and in multiple layers around a round former.

25. A system as recited in claim 23, wherein the warm terminal end of each of the first and second superconducting feeder cables is an integral part of the thermal barrier.

26. A system as recited in claim 23, wherein the warm terminal end of each of the first and second superconducting feeder cables extends into the first or the second volume, beyond the thermal barrier.

27. A system as recited in claim 23, wherein the closed first temperature environment is at a higher pressure than the first and second volumes.

28. A system as recited in claim 23, wherein at least one of the superconducting power cable, or the first or second superconducting feeder cables contain a normal-conducting material, and is configured to provide a level of current sharing between tapes, sufficient to act as fault current limiting device in case of a fault.

29. A system as recited in claim 23, wherein the warm terminal end of the first and second superconducting feeder cables or wires are cooled with a first stage of a two-stage cryocooler, while the closed first temperature environment is cooled with a colder second stage of the same cryocooler through conduction or contact with cryogenic fluid or gas.

30. A system as recited in claim 23, wherein each of the first and second superconducting feeder cables includes a plurality of superconducting tapes that operate in a superconducting state at the second temperature, and wherein the superconducting power cable is configured to operate in a superconducting state at the first temperature.

* * * * *